(12) United States Patent  
Spath et al.

(10) Patent No.: US 7,645,497 B2
(45) Date of Patent: Jan. 12, 2010

(54) MULTI-LAYER CONDUCTOR WITH CARBON NANOTUBES

(75) Inventors: Todd M. Spath, Hilton, NY (US); Glen C. Irvin, Jr., Rochester, NY (US); Debasis Majumdar, Rochester, NY (US); Ronald S. Cok, Rochester, NY (US); Charles C. Anderson, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 294 days.

(21) Appl. No.: 11/143,562

(22) Filed: Jun. 2, 2005

(65) Prior Publication Data

US 2006/0274049 A1 Dec. 7, 2006

(51) Int. Cl.
*G06F 3/041* (2006.01)
*G06F 3/045* (2006.01)

(52) U.S. Cl. .................... 428/1.4; 428/299.1; 345/173

(58) Field of Classification Search .............. 428/1.3, 428/1.4, 297.4, 411.1, 299.1; 345/173; 524/495; 252/500, 502, 511; 977/742, 748
See application file for complete search history.

(56) References Cited

U.S. PATENT DOCUMENTS

| 4,070,189 | A | 1/1978 | Kelley et al. |
|---|---|---|---|
| 4,731,408 | A | 3/1988 | Jasne |
| 4,987,042 | A | 1/1991 | Jonas et al. |
| 5,093,439 | A | 3/1992 | Epstein et al. |
| 5,300,575 | A | 4/1994 | Jonas et al. |
| 5,312,681 | A | 5/1994 | Muys et al. |
| 5,354,613 | A | 10/1994 | Quintens et al. |
| 5,370,981 | A | 12/1994 | Krafft et al. |
| 5,372,924 | A | 12/1994 | Quintens et al. |
| 5,391,472 | A | 2/1995 | Muys et al. |
| 5,403,467 | A | 4/1995 | Jonas et al. |
| 5,443,944 | A | 8/1995 | Krafft et al. |
| 5,561,030 | A | 10/1996 | Holdcroft et al. |
| 5,575,898 | A | 11/1996 | Wolf et al. |
| 5,576,162 | A | 11/1996 | Papadopoulos |
| 5,665,498 | A | 9/1997 | Savage et al. |
| 5,674,654 | A | 10/1997 | Zumbulyadis et al. |
| 5,716,550 | A | 2/1998 | Gardner et al. |
| 5,738,934 | A | 4/1998 | Jones |
| 5,766,515 | A | 6/1998 | Jonas et al. |
| 5,828,432 | A | 10/1998 | Shashidhar et al. |
| 5,959,708 | A | 9/1999 | Lee et al. |
| 5,976,274 | A | 11/1999 | Inoue et al. |
| 5,976,284 | A | 11/1999 | Calvert et al. |
| 6,045,977 | A | 4/2000 | Chandross et al. |

(Continued)

FOREIGN PATENT DOCUMENTS

EP 0 440 957 3/1996

(Continued)

OTHER PUBLICATIONS

U.S. Appl. No. 11/143,539 filed Jun. 2, 2005 Spath et al.

(Continued)

*Primary Examiner*—David R Sample
*Assistant Examiner*—Sophie Hon

(57) ABSTRACT

The present invention is directed to an electronically conductive article comprising at least one conductive carbon nanotube layer in contact with at least one conductive layer comprising electronically conductive polymer.

29 Claims, 16 Drawing Sheets

U.S. PATENT DOCUMENTS

| | | | |
|---|---|---|---|
| 6,404,120 B1 | 6/2002 | Aben et al. | |
| 6,426,134 B1 | 7/2002 | Lavin et al. | |
| 6,455,021 B1 * | 9/2002 | Saito | 423/447.3 |
| 6,469,267 B1 | 10/2002 | Welsh et al. | |
| 6,639,637 B2 | 10/2003 | Stephenson | |
| 6,645,455 B2 | 11/2003 | Margrave et al. | |
| 6,683,783 B1 | 1/2004 | Smalley et al. | |
| 6,707,517 B2 | 3/2004 | Stephenson | |
| 6,737,293 B2 | 5/2004 | Andriessen | |
| 7,067,756 B2 * | 6/2006 | Cok | 200/512 |
| 7,180,108 B2 * | 2/2007 | Kawase et al. | 257/288 |
| 7,230,198 B2 * | 6/2007 | Cok et al. | 200/512 |
| 7,361,927 B2 * | 4/2008 | Kawase et al. | 257/40 |
| 7,378,040 B2 * | 5/2008 | Luo et al. | 252/500 |
| 7,397,466 B2 * | 7/2008 | Bourdelais et al. | 345/173 |
| 2001/0037935 A1 * | 11/2001 | Oya et al. | 200/512 |
| 2003/0008135 A1 | 1/2003 | Kawamura et al. | |
| 2003/0143453 A1 * | 7/2003 | Ren et al. | 429/40 |
| 2003/0158323 A1 | 8/2003 | Connell et al. | |
| 2003/0170492 A1 | 9/2003 | Anderson et al. | |
| 2003/0193042 A1 | 10/2003 | Go et al. | |
| 2004/0065970 A1 | 4/2004 | Blanchet-Fincher | |
| 2004/0144975 A1 * | 7/2004 | Seki et al. | 257/40 |
| 2004/0219093 A1 * | 11/2004 | Kim et al. | 423/447.2 |
| 2004/0265550 A1 * | 12/2004 | Glatkowski et al. | 428/209 |
| 2005/0110766 A1 * | 5/2005 | Kent et al. | 345/173 |
| 2005/0209392 A1 * | 9/2005 | Luo et al. | 524/496 |
| 2006/0118768 A1 * | 6/2006 | Liu et al. | 252/500 |

FOREIGN PATENT DOCUMENTS

| | | |
|---|---|---|
| EP | 0 615 256 | 9/1998 |
| EP | 1 079 397 | 2/2001 |
| EP | 1 172 831 | 1/2002 |
| EP | 0 686 662 | 11/2002 |
| EP | 1 054 414 | 3/2003 |
| EP | 1326260 A1 * | 7/2003 |
| WO | WO 97/18944 | 5/1997 |
| WO | 02/076724 | 10/2002 |
| WO | WO 02/080195 | 10/2002 |
| WO | WO 03/060941 | 7/2003 |
| WO | WO 03/099709 | 12/2003 |
| WO | WO 2004/009884 | 1/2004 |
| WO | WO 2004/029176 | 4/2004 |

OTHER PUBLICATIONS

U.S. Appl. No. 11/143,540. filed Jun. 2, 2005, Spath et al.
*Synthetic Metals*, vol. 142 (2004), pp. 187-193, B. D. Martin et al.
D. Arthur et al., "P-86: Flexible Transparent Circuits from Carbon Nanotubes" SID 04 Digest, vol. XXXV, May 25, 2004, pp. 582-585.

* cited by examiner

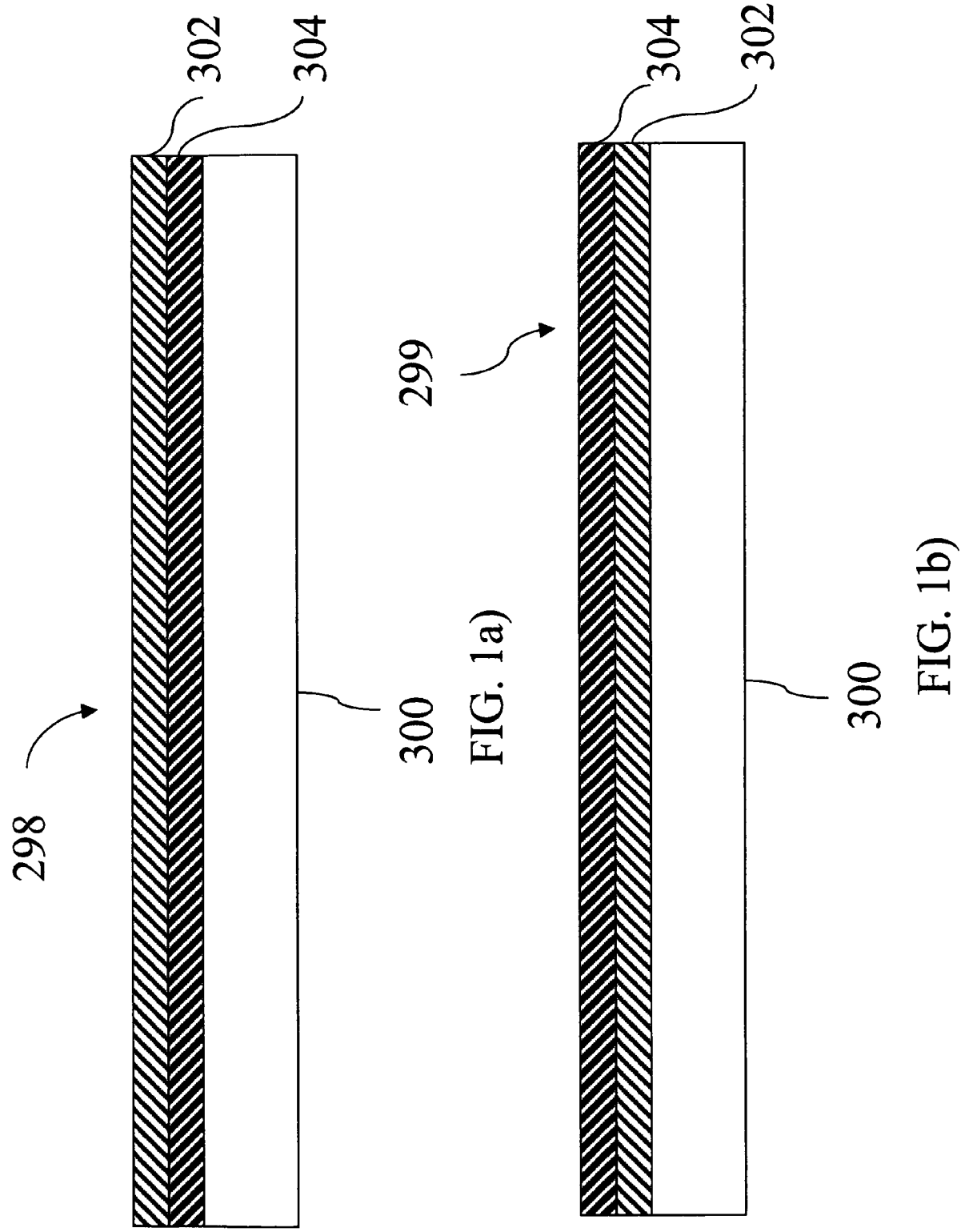

FIG 2a). Pristine SWCNT with closed ends
FIG 2b). Pristine SWCNT with open ends

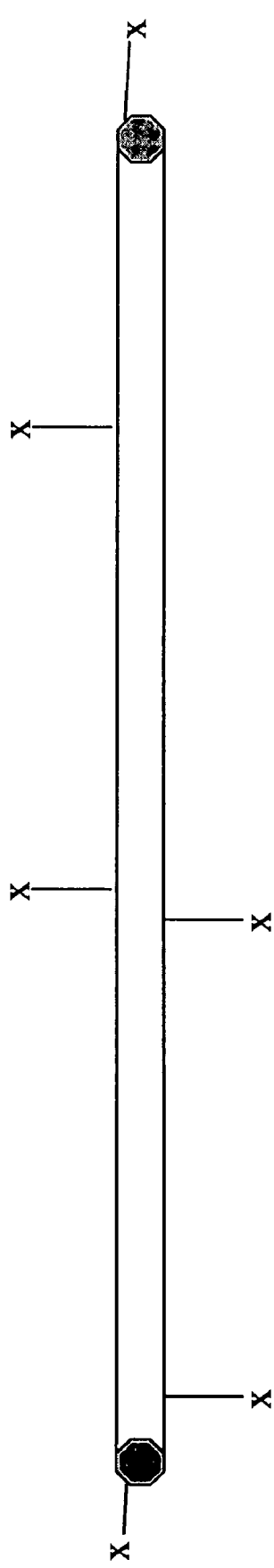# FIG 3a). Functionalized SWCNT with closed ends
# FIG 3b). Functionalized SWCNT with open ends

MULTI-LAYER CONDUCTOR WITH CARBON NANOTUBES

FIELD OF THE INVENTION

The present invention relates to an electronically conductive article comprising at least one conductive carbon nanotube layer in contact with at least one conductive layer comprising electronically conductive polymer.

BACKGROUND OF THE INVENTION

Single wall carbon nanotubes (SWCNTs) are essentially graphene sheets rolled into hollow cylinders thereby resulting in tubules composed of $sp^2$ hybridized carbon arranged in hexagons and pentagons, which have outer diameters between 0.4 nm and 10 nm. These SWCNTs are typically capped on each end with a hemispherical fullerene (buckyball) appropriately sized for the diameter of the SWCNT. However, these end caps may be removed via appropriate processing techniques leaving uncapped tubules. SWCNTs can exist as single tubules or in aggregated form typically referred to as ropes or bundles. These ropes or bundles may contain several or a few hundred SWCNTs aggregated through Van der Waals interactions forming triangular lattices where the tube-tube separation is approximately 3-4 Å. Ropes of SWCNTs may be composed of associated bundles of SWCNTs.

The inherent properties of SWCNTs make them attractive for use in many applications. SWCNTs can possess high (e.g. metallic conductivities) electronic conductivities, high thermal conductivities, high modulus and tensile strength, high aspect ratio and other unique properties. Further, SWCNTs may be metallic, semi-metallic, or semiconducting dependant on the geometrical arrangement of the carbon atoms and the physical dimensions of the SWCNT. To specify the size and conformation of single-wall carbon nanotubes, a system has been developed, described below, and is currently utilized. SWCNTs are described by an index (n, m), where n and m are integers that describe how to cut a single strip of hexagonal graphite such that its edges join seamlessly when the strip is wrapped into the form of a cylinder. When n=m e.g. (n, n), the resultant tube is said to be of the "arm-chair" or (n, n) type, since when the tube is cut perpendicularly to the tube axis, only the sides of the hexagons are exposed and their pattern around the periphery of the tube edge resembles the arm and seat of an arm chair repeated n times. When m=0, the resultant tube is said to be of the "zig zag" or (n, 0) type, since when the tube is cut perpendicular to the tube axis, the edge is a zig zag pattern. Where n≠m and m≠0, the resulting tube has chirality. The electronic properties are dependent on the conformation, for example, arm-chair tubes are metallic and have extremely high electrical conductivity. Other tube types are semimetals or semi-conductors, depending on their conformation. SWCNTs have extremely high thermal conductivity and tensile strength irrespective of the chirality. The work functions of the metallic (approximately 4.7 eV) and semiconducting (approximately 5.1 eV) types of SWCNTs are different.

Similar to other forms of carbon allotropes (e.g. graphite, diamond) these SWCNTs are intractable and essentially insoluble in most solvents (organic and aqueous alike). Thus, SWCNTs have been extremely difficult to process for various uses. Several methods to make SWCNTs soluble in various solvents have been employed. One approach is to covalently functionalize the ends of the SWCNTs with either hydrophilic or hydrophobic moieties. A second approach is to add high levels of surfactant and/or dispersants (small molecule or polymeric) to help solubilize the SWCNTs.

Lavin et al. in U.S. Pat. No. 6,426,134 disclose a method to form polymer composites using SWCNTs. This method provides a means to melt extrude a SWCNT/polymer composite wherein at least one end of the SWCNT is chemically bonded to the polymer, where the polymer is selected from a linear or branched polyamide, polyester, polyimide, or polyurethane. This method does not provide opportunities for solvent based processing and is limited to melt extrusion which can limit opportunities for patterning or device making. The chemically bonded polymers identified typically have high molecular weights and could interfere with some material properties of the SWCNTs (e.g. electronic or thermal transport) via wrapping around the SWCNTs and preventing tube-tube contacts.

Connell et al in US Patent Application Publication 2003/0158323 A1 describes a method to produce polymer/SWCNT composites that are electronically conductive and transparent. The polymers (polyimides, copolyimides, polyamide acid, polyaryleneether, polymethylmethacrylate) and the SWCNTs or MWCNTs are mixed in organic solvents (DMF, N,N-dimethlacetamide, N-methyl-2-pyrrolidinone, toluene,) to cast films that have conductivities in the range of $10^{-5}$-$10^{-12}$ S/cm with varying transmissions in the visible spectrum. Additionally, monomers of the resultant polymers may be mixed with SWCNTs in appropriate solvents and polymerized in the presence of these SWCNTs to result in composites with varying weight ratios. The conductivities achieved in these polymer composites are several orders of magnitude too low and not optimal for use in most electronic devices as electronic conductors or EMI shields. Additionally, the organic solvents used are toxic, costly and pose problems in processing. Moreover, the polymers used or polymerized are not conductive and can impede tube-tube contact further increasing the resistivity of the composite.

Kuper et al in Publication WO 03/060941A2 disclose compositions to make suspended carbon nanotubes. The compositions are composed of liquids and SWCNTs or MWCNTs with suitable surfactants (cetyl trimethylammonium bromide/chloride/iodide). The ratio by weight of surfactant to SWCNTs given in the examples range from 1.4-5.2. This method is problematic as it needs extremely large levels of surfactant to solubilize the SWCNTs. The surfactant is insulating and impedes conductivity of a film deposited from this composition. The surfactant may be washed from the film but this step adds complexity and may decrease efficiency in processing. Further, due to the structure formed in films deposited from such a composition, it would be very difficult to remove all the surfactant.

Papadaopoulos et al. in U.S. Pat. No. 5,576,162 describe an imaging element which comprises carbon nanofibers to be used primarily as an anti-static material within the imaging element. These materials may not provide the highly transparent and highly conductive (low sheet resistance, $R_S$) layer that is necessary in many current electronic devices, especially displays.

Smalley et al in U.S. Pat. No. 6,645,455 disclose methods to chemically derivatize SWCNTs to facilitate solvation in various solvents. Primarily the various derivative groups (alkyl chains, acyl, thiols, aminos, aryls etc.) are added to the ends of the SWCNTs. The side-walls of the SWCNTs are functionalized primarily with fluorine groups resulting in fluorinated SWCNTs. The solubility limit of such "fluorotubes" in 2-propanol is approximately 0.1 mg/mL and in water or water/acetone mixtures the solubility is essentially zero. The fluorinated SWCNTs were subjected to further chemical reactions to yield methylated SWCNTs and these tubes have a low solubility in Chloroform but not other solvents. Such low concentrations are impractical and unusable for most deposition techniques useful in high quantity manufacturing. Further, such high liquid loads need extra drying considerations and can destroy patterned images due to intermixing from the excess solvent. In addition, the method discloses functionalization of the tubule ends with various functionalization groups (acyl, aryl, aralkyl, halogen, alkyl, amino, halogen, thiol) but the end functionalization alone may not be enough to produce viable dispersions via solubilization. Further, the side-wall functionalization is done with fluorine only, which gives limited solubility in alcohols, which can make manufacturing and product fabrication more difficult. Additionally, the fluorinated SWCNTs are insulators due to the fluorination and thereby are not useful for electronic devices especially as electronic conductors. Moreover, the chemical transformations needed to add these functional groups to the end points of the SWCNTs require additional processing steps and chemicals which can be hazardous and costly.

Smalley et al. in U.S. Pat. No. 6,683,783 disclose methods to purify SWCNT materials resulting in SWCNTs with lengths from 5-500 nm. Within this patent, formulations are disclosed that use 0.5 wt % of a surfactant, Triton X-100 to disperse 0.1 mg/mL of SWCNT in water. Such low concentrations are impractical and unusable for most deposition techniques useful in high quantity manufacturing. Further, such high liquid loads need extra drying considerations and can destroy patterned images due to intermixing from the excess solvent. In addition, the method discloses functionalization of the tubule ends with various functionalization groups (acyl, aryl, aralkyl, halogen, alkyl, amino, halogen, thiol) but the end functionalization alone may not be enough to produce viable dispersions via solubilization. Moreover, the chemical transformations needed to add these functional groups to the end points of the SWCNTs require additional processing steps and chemicals which can be hazardous and costly. Also, the patent discloses a composition of matter which is at least 99% by weight of single wall carbon molecules which obviously limits the amount of functionalization that can be put onto the SWCNTs thereby limiting its solubilization levels and processability.

Rinzler et al. in PCT Publication WO2004/009884 A1 disclose a method of forming SWCNT films on a porous membrane such that it achieves 200 ohms/square and at least 30% transmission at a wavelength of 3 um. This method is disadvantaged since it needs a porous membrane (e.g. polycarbonate or mixed cellulose ester) with a high volume of porosity with a plurality of sub-micron pores as a substrate which may lose a significant amount of the SWCNT dispersion through said pores thereby wasting a significant amount of material. Also, such membranes may not have the optical transparency required for many electronic devices such as displays. Further, the membrane is set within a vacuum filtration system which severely limits the processability of such a system and makes the roll-to-roll coating application of the SWCNT solution impossible. Moreover, the weight percent of the dispersion used to make the SWCNT film was 0.005 mg/mL in an aqueous solution. Such weight percents are impractical and unusable in most coating and deposition systems with such a high liquid load. Such high liquid loads make it virtually impossible to make patterned images due to solvent spreading and therefore image bleeding/destruction.

Blanchet-Fincher et al in Publication WO 02/080195A1 and in US 20040065970 A1 illustrate high conductivity compositions composed of polyaniline (PANI) and SWCNTs or MWCNTs and methods to deposit such compositions from a donor element onto a receiver substrate. The nitrogen base salt derivative of emeraldine polyaniline is mixed with SWCNTs in organic solvents (toluene, xylene, turpinol, aromatics) and cast into films with conductivity values of 62 S/cm (1 wt % SWCNT in PANI) and 44 S/cm (2 wt % SWCNT in PANI). These films alternatively may be produced as part of a multi-layer donor structure suitable for a material transfer system. The PANI/SWCNT composite are transferred from the donor sheet to a suitable receiver substrate in imagewise form. PANI is a highly colored conductive polymer thus resulting in a conductive composite with unsatisfactory transparency and color, thus it is not suitable for high transparency/high conductivity applications such as displays. Further, the conductivity values are not suitable for many electronic device applications. In addition, the compositions are made in organic solvents, which may require special handling for health and safety, making manufacturing difficult and expensive.

Hsu in WO 2004/029176 A1 disclose compositions for electronically conducting organic polymer/nanoparticle composites. Polyaniline (Ormecon) or PEDT (Baytron P) are mixed with Molybdenum nanowires or carbon nanotubes (8 nm diameter, 20 um length, 60 S/cm). The compositions disclosed in this invention are disadvantaged by marginal conductivity.

Arthur et al in PCT Publication WO 03/099709 A2 disclose methods for patterning carbon nanotubes coatings. Dilute dispersions (10 to 100 ppm) of SWCNTs in isopropyl alcohol (IPA) and water (which may include viscosity modifying agents) are spray coated onto substrates. After application of the SWCNT coating, a binder is printed in imagewise fashion and cured. Alternatively, a photo-definable binder may be used to create the image using standard photolithographic processes. Materials not held to the substrate with binder are removed by washing. Dilute dispersions (10 to 100 ppm) of SWCNTs in isopropyl alcohol (IPA) and water with viscosity modifying agents are gravure coated onto substrates. Dilute dispersions (10 to 100 ppm) of SWCNTs in isopropyl alcohol (IPA) and water are spray coated onto substrates. The coated films are then exposed through a mask to a high intensity light source in order to significantly alter the electronic properties of the SWCNTs. This step is followed by a binder coating. The dispersion concentrations used in these methods make it very difficult to produce images via direct deposition (inkjet etc.) techniques. Further, such high solvent loads due to the low solids dispersions create long process times and difficulties handling the excess solvent. In addition, these patterning methods are subtractive processes, which unnecessarily waste the SWCNT material via additional removal steps thereby incurring cost and process time. This application also discloses method to make conductive compositions and coatings from such compositions but it does not teach satisfactory methods nor compositions to execute such methods.

Transparent electronically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors and electrochromic windows or as components of these devices such as electromagnetic interference (EMI) shielding. They are also employed in resistive touch screens.

Devices such as flat-panel displays, typically contain a substrate provided with an indium tin oxide (ITO) layer as a transparent electrode. The coating of ITO is carried out by vacuum sputtering methods which involve high substrate temperature conditions up to 250° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties. Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, lower cost, and lower weight.

Intrinsically conductive polymers have recently received attention from various industries because of their electronic conductivity. Although many of these polymers are highly colored and are less suited for TCL applications, some of these intrinsically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity instead of ionic conductivity, these polymers are conducting even at low humidity.

EP-A-440 957 describes a method for preparing polythiophene in an aqueous mixture by oxidative polymerization in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene. Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030 a similar method is used to form the pattern except that the pattern is formed in a continuous layer of prepolymer which is not yet conductive and that after washing the mask away the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise non-conductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas.

EP-A-1 054 414 describes a method to pattern a conductive polymer layer by printing an electrode pattern onto said conductive polymer layer using a printing solution containing an oxidant selected from the group $ClO^-$, $BrO^-$, $MnO_4^-$, $Cr_2O_7^{-2}$, $S_2O_8^{-2}$, and $H_2O_2$. The areas of the conductive layer exposed to the oxidant solution are rendered nonconductive.

Research Disclosure, November 1998, page 1473 (disclosure no. 41548) describes various means to form patterns in conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface, which should be avoided.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

The application of electronically conductive polymers in display related device has been envisioned in the past. European Patent Application 1,172,831 describes a light transmissive substrate having a light transmissive conductive polymer coating for use in resistive touch screens. U.S. Pat. No. 5,738,934 describes touchscreen cover sheets having a conductive polymer coating.

U.S. Pat. Nos. 5,828,432 and 5,976,284 describe conductive polymer layers employed in liquid crystal display devices. The example conductive layers are highly conductive but typically have transparency of 60% or less.

Use of polythiophene as transparent field spreading layers in displays comprising polymer dispersed liquid crystals has been disclosed in U.S. Pat. Nos. 6,639,637 and 6,707,517. However, the polythiophene layers in these patents are non-conductive in nature.

Use of commercial polythiophene coated sheet such as Orgacon from Agfa has been suggested for manufacturing of thin film inorganic light emitting diode in U.S. Pat. No. 6,737,293. However, the transparency vs. surface electrical resistivity of such products may not be sufficient for some applications.

Use of conductive high molecular film for preventing the fringe field in the in-plane switching mode in liquid crystal display has been proposed in U.S. Pat. No. 5,959,708. However, the conductivity requirement for these films appears to be not very stringent. For example, in one embodiment (col. .5, lines 6-10) the high molecular film can be totally non-conductive. Moreover, U.S. Pat. No. 5,959,708 does not refer to any specification involving transmission characteristics of these films.

Use of transparent coating on glass substrates for cathode ray tubes using polythiophene and silicon oxide composites has been disclosed in U.S. Pat. No. 6,404,120. However, the method suggests in-situ polymerization of an ethylenedioxythiohene monomer on glass, baking it at an elevated temperature and subsequent washing with tetra ethyl orthosilicate. Such an involved process may be difficult to practice for roll-to-roll production of a wide flexible plastic substrate.

Use of in-situ polymerized polythiophene and polypyrrole has been proposed in U.S. Pat Appl. Pub. 2003/0008135 A1 as conductive films, for ITO replacement. As mentioned earlier, such processes are difficult to implement for roll-to-roll production of conductive coatings. In the same patent application, a comparative example was created using a dispersion of poly(3,4 ethylene dioxythiophene)/polystyrene sulfonic acid which resulted in inferior coating properties.

Addition of conductivity enhancing agents such as organic compounds with dihydroxy or polyhydroxy and/or carboxyl groups or amide groups or lactam groups are suggested for incorporation in polythiophene in U.S. Pat. No. 5,766,515. Recently, U.S. Pat. Appl. Pub. 2003/0193042 A1 claims further improvement in conductivity of polythiophene through the addition of a substantial quantity of organic compounds such as phenols. But, health and safety concerns will dictate special precautionary measures, which may need to be taken, for the introduction of such hazardous compounds to a typical web manufacturing and coating site, thus possibly adding cost to the final product.

In another recent publication titled "Hydroxylated secondary dopants for surface resistance enhancement in transparent poly(3,4-ethylenedioxythiophene)-poly(styrenesulfonate) thin films" by B. D. Martin, N. Nikolov, S. K. Pollack, A. Saprigin, R. Shashidhar, F. Zhang and P. A. Heiney, published in Synthetic Metals, vol. 142 (2004), p. 187-193, it was stated that the addition of small hydroxylated secondary dopants could greatly decrease the surface resistance of polythiophene films without reducing film transparency.

Devices such as resistive touch screens also employ a substrate provided with transparent conductors. Typically substrates are formed from rigid glass and a coating of ITO forms the transparent conductor. However, in this application, a flexible transparent cover sheet coated with a transparent conductor overlies the substrate and is separated from the substrate by spacer dots. The flexible cover sheet is deformed in operation by a stylus or finger to bring the two transparent conductive layers into contact. ITO is also commonly employed as the transparent conductor on the flexible transparent cover sheet. However, ITO tends to crack under stress and its conductivity altered. More flexible conductive polymers have also been considered for this application, but these conductive polymers are softer than ITO and tend to degrade from repeated contacts.

As indicated herein above, the art discloses a wide variety of electronically conductive TCL compositions that can be incorporated in displays and touch screens. Although application of electronically conductive polymers in display and touch screen related devices has been contemplated in the past, the stringent requirements of high transparency, low surface electrical resistivity, flexibility, and robustness under repeated contact demanded by modern display devices or touch screens is extremely difficult to attain with electronically conductive polymers. Thus, there is still a critical need in the art for transparent conductors that can be coated roll-to-roll on a wide variety of substrates under typical manufacturing conditions using environmentally desirable components. In addition to providing superior electrode performance, the TCL layers also must be highly transparent, must be patternable, must resist the effects of humidity change, and be manufacturable at a reasonable cost.

PROBLEM TO BE SOLVED BY THE INVENTION

There is a need to provide improved electronically conductive, patternable, preferably coatable, conductive films that more effectively meet the diverse commercial needs than those of the prior art toward which the present invention is directed.

SUMMARY OF THE INVENTION

The present invention provides an electronically conductive article comprising at least one conductive carbon nanotube layer in contact with at least one conductive layer comprising electronically conductive polymer.

BRIEF DESCRIPTION OF THE DRAWINGS

FIGS. 1A and 1B. A cross section of a conductive article, as per the invention.

FIGS. 2A and 2B. A schematic of pristine single wall carbon nanotubes with closed ends of the tubules and with open ends.

FIGS. 3A and 3B. A schematic of functionalized single wall carbon nanotubes with closed ends of the tubules and with open ends.

DETAILED DESCRIPTION OF THE INVENTION

Figure 4:
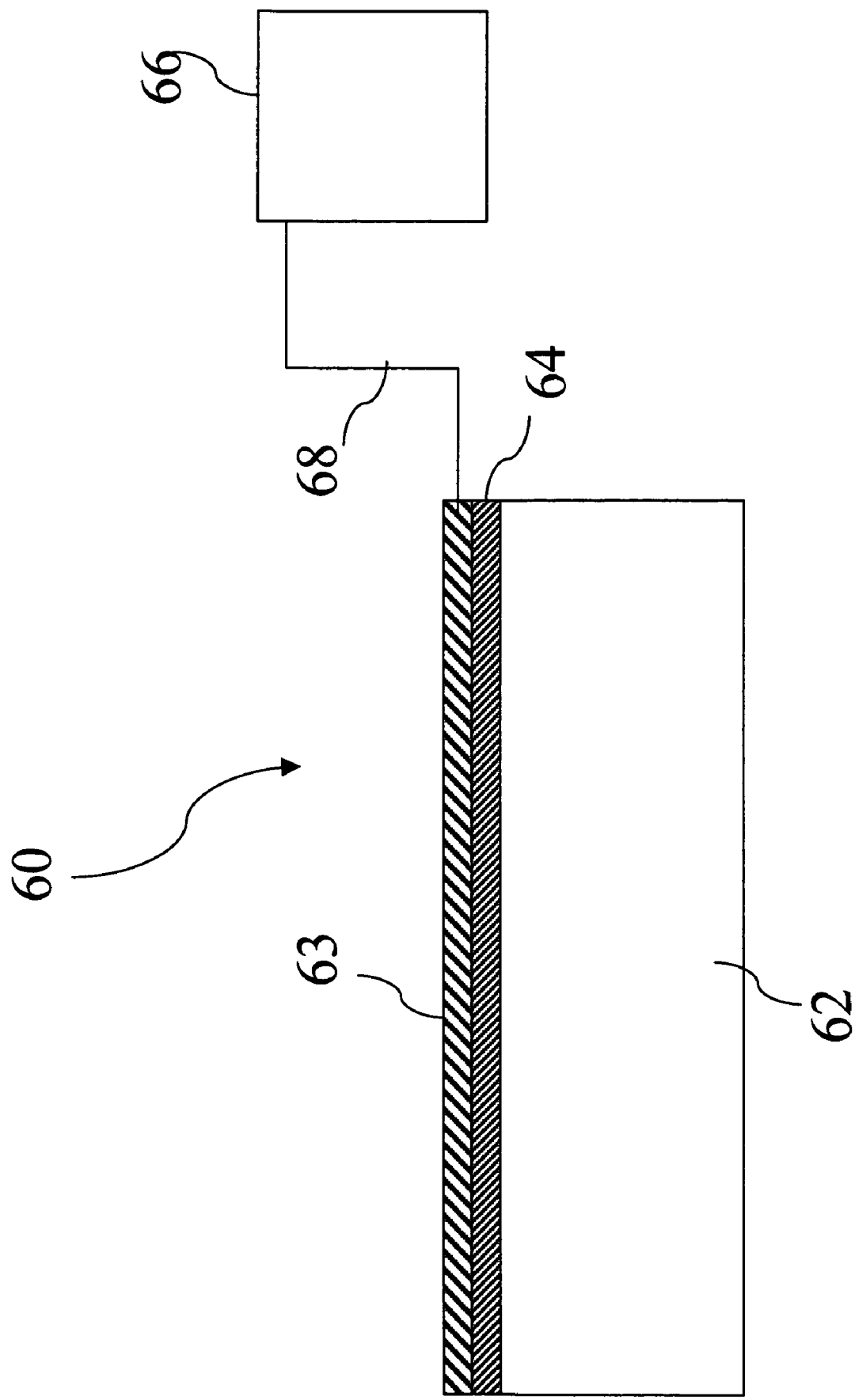
FIG. 4. A schematic of a display component comprising an electronically conductive article connected to a power source by an electric lead, as per the invention.

The invention has numerous advantages. The invention provides a facile method to improve the conductivity and robustness of an electronically conductive article by utilizing both an electronically conductive polymer layer and a layer of highly conductive and mechanically stable carbon nanotubes. Moreover, the invention provides highly transparent conductive articles. These and other advantages will be apparent from the detailed description below.

Referring to FIG. 1b, an electronically conductive article 298 in one embodiment of the invention comprises a conductive layer 302 comprising electronically conductive polymer that may be formed on a substrate 300. A layer of carbon nanotubes 304 is formed over the electronically conductive polymer layer 302.

FIG. 1a illustrates an alternative electronically conductive article 299, which comprises a layer of carbon nanotubes 304 that may be formed on a substrate 300. A conductive layer 302 comprising electronically conducitve polymer is formed over the carbon nanotube layer 304.

The carbon nanotubes suitable for use in the conductive layers of the invention may be formed by any known methods in the art (laser ablation, CVD, arc discharge). The carbon nanotubes are preferred to have minimal or no impurities of carbonaceous impurities that are not carbon nanotubes (graphite, amorphous, diamond, non-tubular fullerenes, multiwall carbon nanotubes) or metal impurities. It is found that the transparency increases significantly with reduced levels of metallic and carbonaceous impurities. Conductive layer film quality, as evidenced by layer uniformity, surface roughness, and a reduction in particulates, also improves with a decrease in the amount of metal and carbonaceous impurities.

To achieve high electronic conductivity, metallic SWCNTs are the most preferred type of carbon nanotube but semimetallic and semiconducting SWCNTs may also be used. A pristine SWCNT means that the surface of the SWCNT is free of covalently functionalized materials either through synthetic prep, acid cleanup of impurities, annealing or directed functionalization. For the purpose of the present invention, however, the SWCNTS are preferably functionalized. The preferred functional group is a hydrophilic species selected from carboxylic acid, carboxylate anion (carboxylic acid salt), hydroxyl, sulfur containing groups, carbonyl, phosphates, nitrates or combinations of these hydrophilic species. In some applications other types of functionalization such as polymer, small molecule or combinations thereof may be required. For example, such functionalization may improve the compatibility of the SWCNT in a particular polymer matrix.

Turning now to FIG. 2, pristine SWCNTs with either open or closed ends are illustrated. SWCNTs that are pristine are essentially intractable in most solvents, especially aqueous media, without the use of high levels of dispersants. Therefore, it is not possible to use only pristine SWCNTs and water to produce an aqueous coating composition. FIG. 3 exemplifies the basic structure of covalently functionalized SWCNTs. The X in FIG. 3 may be selected from one of the hydrophilic species listed above. It is worth noting that the X may be positioned at any point on the SWCNT, external or internal surface, open or closed end, or sidewall. It is preferred that the X be uniformly distributed across the external surface, potentially for the most effectiveness.

The most preferred covalent surface functionalization is carboxylic acid or a carboxylic acid salt or mixtures thereof (hereafter referred to as only carboxylic acid). For carboxylic acid based functionalization, the preferred level of functionalized carbons on the SWCNT is 0.5-100 atomic percent, where 1 atomic percent functionalized carbons would be 1 out of every 100 carbons in the SWCNT have a functional group covalently attached. The functionalized carbons may exist anywhere on the nanotubes (open or closed ends, external and internal sidewalls). As already mentioned, preferably the functionalization is on the external surface of the SWCNTs. More preferably the functionalized percent range is 0.5-50 atomic percent, and most preferably 0.5-5 atomic percent. Functionalization of the SWCNTs with these groups within these atomic percent ranges allows the preparation of stable dispersions at the solids loadings necessary to form highly conductive, transparent films by conventional coating means. This method allows for very effective dispersion in substantially aqueous dispersions and does not require a dispersion aid. Additionally, the most efficient level of functionalization will provide the desired dispersion without significantly altering the electronic properties of the carbon nanotubes. Transparency is defined as a conductive layer that has greater than 60% bulk transmission. This transparency may be achieved by producing thin coatings with thicknesses less than 1 micrometer. The functionalization may be carried out by a number of routes. Typically, the raw material (unfunctionalized) SWCNTs are added to a bath of strongly oxidizing agents (hydrochloric acid, hydrofluoric acid, hydrobromic acid, hydroiodic acid, sulfuric acid, oleum, nitric acid, citric acid, oxalic acid, chlorosulfonic acid, phosphoric acid, trifluoromethane sulfonic acid, glacial acetic acid, monobasic organic acids, dibasic organic acids, potassium permanganate, persulfate, cerate, bromate, hydrogen peroxide, dichromate) which may be mixtures. Sulfuric acid, nitric acid, permanganate, and chlorosulfonic acids are preferred due to the efficacy of the oxidation and functionalization. Temperatures from 20° C.-120° C. are typically used in reflux of this mixture of SWCNTs and strong oxidizing agents with appropriate agitation over 1 hr—several days process time. At the end of this process, the raw SWCNTs are now functionalized SWCNTs. The residual oxidizing agents are removed via separation technologies (filtration wash, centrifugation, cross-flow filtration) such that a powder of the functionalized SWCNTs (primarily carboxylic acid functionalities) remains after appropriate heating to dry.

The pH of the dispersion and the coating composition is important. As the pH becomes more basic (above the pKa of the carboxylic acid groups), the carboxylic acid will be ionized thereby making the carboxylate anion, a bulky, repulsive group which can aid in the stability. Preferred pH ranges from 3-10 pH. More preferred pH ranges from 3-6.

The length of the SWCNTs may be from 20 nm-1 m, more typically from 20 nm to 50 um. The SWCNTs may exist as individual SWCNTs or as bundles of SWCNTs. The diameter of a SWCNT in the conductive layer may be 0.05 nm-5 nm. The SWCNTs in bundled form may have diameters ranging from 1 nm-1 um. Preferably such bundles will have diameters less than 50 nm and preferably less than 20 nm and lengths of between 20 nm and 50 um. It is important that higher surface area is achieved to facilitate transfer of electrons and higher available surface area is achieved by having smaller bundle sizes thereby exposing surfaces of SWCNTs which may be at the internal position of the bundles and not accessible. The ends of the SWCNTs may be closed by a hemispherical buckyball of appropriate size. Alternatively, both of the ends of the SWCNTs may be open. Some cases may find one end open and the other end closed.

The functionalized SWCNTs (produced as described above or purchased from a vendor) are used to form aqueous dispersions with SWCNT solids loadings in the 0.05-10 wt % (500-100000 ppm range). More preferably the SWCNT solids loadings are 0.1-5 wt %. Most preferably the solid loadings are 0.1-1 wt % SWCNT. This solids loading range allows for facile coating to occur and also minimizes the viscosity such that roll coating and/or inkjet printing can be performed in standard practice. The functionalized SWCNTs are often in powder/flake form and require energy to disperse. A typical dispersion process may use a high shear mixing apparatus (homogenizer, microfluidizer, cowles blade high shear mixer, automated media mill, ball mill) for several minutes to an hour. We have also found that standard ultrasonication and bath sonication may be sufficient to disperse the functionalized SWCNTs. Typically, a 0.1 wt % (1000 ppm) SWCNT dispersion in deionized water is formed by bath sonication for 2-24 hrs (dependant on the level of hydrophilic functionalization). After the dispersion process, pH can be adjusted to desired range. A centrifugation or filtration process is used to remove large particulates. The resultant dispersion will be stable for several months on standing (dependant on the level of hydrophilic functionalization). This dispersion has solids loadings high enough to produce conductive coatings in single pass modes for many coating techniques.

The conductive layer of the invention should contain about 0.1 to about 1000 mg/m² dry coating weight of the functionalized SWCNT. Preferably, the conductive layer should contain about 0.5 to about 500 mg/m² dry coating weight of the functionalized SWCNT. This range of SWCNT in the dry coating is easily accessible by standard coating methods, will give the best transmission properties, and minimizes cost to achieve the desired sheet resistance. The actual dry coating weight of the SWCNTs applied is determined by the properties for the particular conductive functionalized SWCNT employed and by the requirements for the particular application, such requirements may include, for example, the conductivity, transparency, optical density, cost, etc for the layer.

In a preferred embodiment, the layer containing the conductive SWCNTs is prepared by applying a mixture containing:

a) a SWCNT according to Formula I;

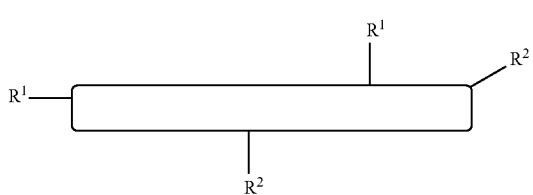

I wherein each of $R^1$ and $R^2$ independently represents carboxylic acid, carboxylate anion (carboxylic acid salt), hydroxyl, sulfur containing groups, carbonyl, phosphates, and/or nitrates, and the tube is a single wall carbon nanotube composed of carbon atoms substantially in hexagonal configuration, and, optionally b) a dispersant and, optionally c) a polymeric binder.

The $R^1$ and $R^2$ substituents may be uniformly or non-uniformly distributed across the SWCNT. The dispersant loading in the dispersion is preferred to be minimal to none. The maximum dispersant loading is preferred to be 50 wt % of the weight of the SWCNT. The more preferred dispersant loading is less than 5 wt % of the weight of the SWCNT. The most preferred dispersant loading is 0 wt %. With decreasing levels of dispersant, the electronic conductivity increases. There are many dispersants which may be chosen. Preferred dispersants are octylphenol ethoxylate (TX-100), sodium dodecyl sulfate, sodium dodecylbenzenesulfonate, poly(styrene sulfonate), sodium salt, poly(vinylpyrrolidone block copolymers of ethylene oxide and propylene oxide (Pluronics or Poloxamers), Polyoxyethylene alkyl ethers (Brij 78, Brij 700), and cetyl or dodecyltrimethylammonium bromide. These dispersants are able to effectively disperse carbon nanotubes at low dispersant loadings which is preferred so that the impact on electronic conductivity is minimal. Appropriate mixtures of these dispersants may be utilized.

Additionally, a preferred embodiment for functionalization of this invention can preferably be where the functional group is a sulfur containing group selected from:

$R—SO_xZ_y$

Where R is a carbon within the lattice of a SWCNT, x may range from 1-3 and Z may be a Hydrogen atom or a metal cation such metals as Na, Mg, K, Ca, Zn, Mn, Ag, Au, Pd, Pt, Fe, Co and y may range from 0-1 or combinations these hydrophilic species. The sulfur containing groups listed above may be sulfonic acid, sulfonic acid and/or sulfonic acid and/or the corresponding anions or mixtures thereof. The most preferred sulfur containing group covalent surface functionalization is sulfonic acid or a sulfonic acid salt or mixtures thereof (hereafter referred to as only sulfonic acid Covalently attached sulfonic acid gives best dispersions of carbon nanotubes amongst the sulfur containing groups.

For environmental reasons, substantially aqueous dispersions of carbon nanotubes (meaning at least 60 wt % water in the dispersion) are preferred for application of the carbon nanotube layer.

Electronically conductive polymers that are suitable in the practice of the invention may be soluble or dispersible in organic solvents or water or mixtures thereof. The conductive poly(3,4-ethylenedioxythiophene) (PEDOT) may be supplied by either of two routes. First, it may be synthesized via an in-situ oxidative polymerization where the monomer, ethylenedioxythiophene (EDOT), is dissolved within a suitable solvent (e.g. butanol). There are a number of oxidizing agents that may be used including ammonium persulfate, and iron (III) salts of organic and inorganic acids. Second, an aqueous dispersion of a cationic PEDOT mixed with a polyanion, such as polystyrenesulfonic acid, may be used. For environmental reasons, aqueous compositions are preferred.

A preferred electronically conductive polymer comprises 3,4-dialkoxy substituted polythiophene styrene sulfonate because of its relatively neutral color. The most preferred electronically conductive polymers include poly(3,4-ethylene dioxythiophene styrene sulfonate) which comprises poly (3,4-ethylene dioxythiophene) in a cationic form with polystyrenesulfonic acid. The advantage of choosing the aforementioned polymers arise from the fact that they are primarily water based, stable polymer structure to light and heat, stable dispersions and cause minimum concern for storage, health, environmental and handling. The polystyrenesulfonic acid is preferred as it stabilizes the PEDOT polymer very efficiently and helps in dispersion in aqueous systems. An alternative electronically conductive polymer is polyaniline.

Preparation of the aforementioned polythiophene-based polymers has been discussed in detail in a publication titled "Poly(3,4-ethylenedioxythiophene) and its derivatives: past, present and future" by L. B. Groenendaal, F. Jonas, D. Freitag, H. Pielartzik and J. R. Reynolds in Advanced Materials, (2000), 12, No. 7, pp. 481-494, and references therein.

The electronically conductive polymer layer of the invention should contain about 0.1 to about 1000 mg/m² dry coating weight of the electronically conductive polymer. Preferably, the conductive layer should contain about 1 to about 500 mg/m² dry coating weight of the electronically conductive polymer. The actual dry coating weight of the conductive polymer applied is determined by the properties of the particular conductive polymer employed and by the requirements of the particular application. These requirements include conductivity, transparency, optical density and cost for the layer.

In a preferred embodiment, the layer containing the electronically conductive polymer is prepared by applying a mixture comprising:

a) a polythiophene according to Formula II

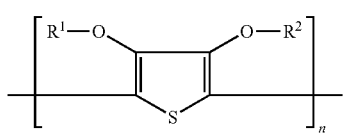

in a cationic form, wherein each of R1 and R2 independently represents hydrogen or a C1-4 alkyl group or together represent an optionally substituted C1-4 alkylene group or a cycloalkylene group, preferably an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000;

and b) a polyanion compound;

It is preferred that the electronically conductive polymer and polyanion combination is soluble or dispersible in organic solvents or water or mixtures thereof. For environmental reasons, aqueous systems are preferred. Polyanions used with these electronically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention because they are widely available and water coatable. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electronically conducting polymers and polyanions, mixtures of alkali salts of polyacids and appropriate amounts of monoacids may also be used. The polythiophene to polyanion weight ratio can widely vary between 1:99 to 99:1, however, optimum properties such as high electrical conductivity and dispersion stability and coatability are obtained between 85:15 and 15:85, and more preferably between 50:50 and 15:85. The most preferred electronically conductive polymers include poly(3,4-ethylene dioxythiophene styrene sulfonate) which comprises poly(3,4-ethylene dioxythiophene) in a cationic form and polystyrenesulfonic acid because of its low optical density, stability, wide availability, high conductivity and ability to be coated from water.

Desirable results such as enhanced conductivity of the PEDOT/polystyrenesulfonic acid can be accomplished by incorporating a conductivity enhancing agent (CEA). Preferred CEAs (due to the effectiveness of reducing the resistivity) are organic compounds containing dihydroxy, polyhydroxy, carboxyl, amide, or lactam groups, such as (1) those represented by the following Formula II:

$$(OH)_n-R-(COX)_m \qquad \text{II}$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (2) a sugar, sugar derivative, polyalkylene glycol, or glycerol compound; or (3) those selected from the group consisting of N-methylpyrrolidone, pyrrolidone, caprolactam, N-methyl caprolactam, dimethyl sulfoxide or N-octylpyrrolidone; or (4) a combination of the above.

Particularly preferred conductivity enhancing agents are: sugar and sugar derivatives such as sucrose, glucose, fructose, lactose; sugar alcohols such as sorbitol, mannitol; furan derivatives such as 2-furancarboxylic acid, 3-furancarboxylic acid and alcohols. Ethylene glycol, glycerol, di- or triethylene glycol are most preferred because they provide the maximum conductivity enhancement.

The CEA can be incorporated by any suitable method. Preferably the CEA is added to the coating composition comprising the SWCNTs, the electronically conductive polymer, or both coating compositions. Alternatively, the coated SWCNT and electronically conductive layer containing layers can be exposed to the CEA by any suitable method, such as post-coating wash.

The concentration of the CEA in the coating composition may vary widely depending on the particular organic compound used and the conductivity requirements. However, convenient concentrations that may be effectively employed in the practice of the present invention are about 0.5 to about 25 weight %; more conveniently 0.5 to 10 and more desirably 0.5 to 5 as it provides the minimum effective amount.

While the nanotubes and the electronically conductive polymer can be applied without the addition of a film-forming polymeric binder, a film-forming binder can be employed to improve the physical properties of the layers. In such an embodiment, the layers may comprise from about 1 to 95% of the film-forming polymeric binder. However, the presence of the film forming binder may increase the overall surface electrical resistivity of the layers. The optimum weight percent of the film-forming polymer binder varies depending on the electrical properties of the carbon nanotubes and the electronically conductive polymer, the chemical composition of the polymeric binder, and the requirements for the particular circuit application.

Polymeric film-forming binders useful in the conductive layers of this invention can include, but are not limited to, water-soluble or water-dispersible hydrophilic polymers such as gelatin, gelatin derivatives, maleic acid or maleic anhydride copolymers, polystyrene sulfonates, cellulose derivatives (such as carboxymethyl cellulose, hydroxyethyl cellulose, cellulose acetate butyrate, diacetyl cellulose, and triacetyl cellulose), polyethylene oxide, polyvinyl alcohol, and poly-N-vinylpyrrolidone. Other suitable binders include aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes and polyesterionomers.

Other ingredients that may be included in the conductive layers include but are not limited to surfactants, defoamers or coating aids, charge control agents, thickeners or viscosity modifiers, antiblocking agents, coalescing aids, crosslinking agents or hardeners, soluble and/or solid particle dyes, matte beads, inorganic or polymeric particles, adhesion promoting agents, bite solvents or chemical etchants, lubricants, plasticizers, antioxidants, colorants or tints, and other addenda that are well-known in the art. Preferred bite solvents can include any of the volatile aromatic compounds disclosed in U.S. Pat. No. 5,709,984, as "conductivity-increasing" aromatic compounds, comprising an aromatic ring substituted with at least one hydroxy group or a hydroxy substituted substituents group. These compounds include phenol, 4-chloro-3-methyl phenol, 4-chlorophenol, 2-cyanophenol, 2,6-dichlorophenol, 2-ethylphenol, resorcinol, benzyl alcohol, 3-phenyl-1-propanol, 4-methoxyphenol, 1,2-catechol, 2,4-dihydroxytoluene, 4-chloro-2-methyl phenol, 2,4-dinitrophenol, 4-chlororesorcinol, 1-naphthol, 1,3-naphthalenediol and the like. These bite solvents are particularly suitable for polyester based polymer sheets of the invention. Of this group, the most preferred compounds are resorcinol and 4-chloro-3-methyl phenol. Preferred surfactants suitable for these coatings include nonionic and anionic surfactants. Preferred crosslinking agents suitable for these coatings include silane compounds such as those disclosed in U.S. Pat. No. 5,370,981.

A figure of merit (FOM) can be assigned to the electronically conductive polymer within the conductive layer. Such FOM values are determined by (1) measuring the visual light transmission (T) and the sheet resistance ($R_S$) of the conductive layer at various thickness values of the layer, (2) plotting these data in a ln (1/T) vs. $1/R_S$ space, and (3) then determining the slope of a straight line best fitting these data points and passing through the origin of such a plot. Without being bound to any particular theory, it is found that ln (1/T) vs. $1/R_S$ plots for electronically conductive polymer layers, particularly those comprising polythiophene in a cationic form with a polyanion compound, generate a linear relationship, preferably one passing through the origin, wherein the slope of such a linear plot is the FOM of the electronically conductive polymer layer. Without being bound to any particular theory, it is also found that lower the FOM value, the more desirable is the electrical and optical characteristics of the electronically conductive layer; namely, lower the FOM, lower is the $R_S$ and higher is the transparency of the conductive multilayer. For the instant invention, FOM values of <100, preferably ≦50, and more preferably ≦40 is found to generate most desired results for display applications, Visual light transmission value T is determined from the total optical density at 530 nm, after correcting for the contributions of the uncoated substrate. A Model 361T X-Rite densitometer measuring total optical density at 530 nm, is best suited for this measurement.

Visual light transmission, T, is related to the corrected total optical density at 530 nm, o.d.(corrected), by the following expression, $$T=1/(10^{o.d.(corrected)})$$

The $R_S$ value is typically determined by a standard four-point electrical probe.

The $R_S$ value of the conductive multilayer of the invention can vary according to need. For use as an electrode in a display device, the $R_S$ is typically less than 10000 ohms/square, preferably less than 5000 ohms/square, and more preferably less than 1000 ohms/square and most preferably less than 500 ohms/square, as per the current invention.

The transparency of the conductive multilayer of the invention can vary according to need. For use as an electrode in a display device, the conductive multilayer is desired to be highly transparent. Accordingly, the visual light transmission value T for the conductive layer of the invention is >65%, preferably ≧70%, more preferably ≧80%, and most preferably ≧90%. The conductive layer need not form an integral whole, need not have a uniform thickness and need not be contiguous with the base substrate.

The present invention has an additional advantage over other conductors found in the prior art. ITO, conductive polymers, and carbon nanotubes each have a slight coloration that is generally objectionable in display applications. Applicants have determined that the multi-layer construction of the present invention provides a more neutral coloration.

The electronically conductive article can be prepared by numerous methods. A first conductive layer, for example comprising electronically conductive polymer is formed from liquid medium. The liquid coating composition can be coated on a substrate by any number of coating methods as outlined below. Coating aids may be added to the liquid coating composition to improve coating quality. After this first layer is dried, a second conductive layer, for example a conductive carbon nanotube layer, may be then be applied from liquid medium by any number of coating methods outlined below, and dried to form a robust, hard, flexible conductive layer.

The conductive layers of the invention can be formed on any rigid or flexible substrate. This substrate may serve as a component of a larger system, for example as the substrate or cover of a display device or a touch screen. The substrates can be transparent, translucent or opaque, and may be colored or colorless. Rigid substrates can include glass, metal, ceramic and/or semiconductors. Flexible substrates, especially those comprising a plastic substrate, are preferred for their versatility and ease of manufacturing, coating and finishing.

The flexible plastic substrate can be any flexible self-substrateing plastic film that substrates the conductive polymeric film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic film must have sufficient thickness and mechanical integrity so as to be self-substrateing, yet should not be so thick as to be rigid. Another significant characteristic of the flexible plastic substrate material is its glass transition temperature (Tg). Tg is defined as the glass transition temperature at which plastic material will change from the glassy state to the rubbery state. It may comprise a range before the material may actually flow. Suitable materials for the flexible plastic substrate include thermoplastics of a relatively low glass transition temperature, for example up to 150° C., as well as materials of a higher glass transition temperature, for example, above 150° C. The choice of material for the flexible plastic substrate would depend on factors such as manufacturing process conditions, such as deposition temperature, and annealing temperature, as well as post-manufacturing conditions such as in a process line of a displays manufacturer. Certain of the plastic substrates discussed below can withstand higher processing temperatures of up to at least about 200° C., some up to 300°-350° C., without damage.

Typically, the flexible plastic substrate is a polyester including polyethylene terephthalate (PET), polyethylene naphthalate (PEN), polyester ionomer, polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA) natural and synthetic paper, resin-coated or laminated paper, voided polymers including polymeric foam, microvoided polymers and microporous materials, or fabric, or any combinations thereof.

Aliphatic polyolefins may include high density polyethylene (HDPE), low density polyethylene (LDPE), and polypropylene, including oriented polypropylene (OPP). Cyclic polyolefins may include poly(bis(cyclopentadiene)). A preferred flexible plastic substrate is a cyclic polyolefin or a polyester. Various cyclic polyolefins are suitable for the flexible plastic substrate. Examples include Arton® made by Japan Synthetic Rubber Co., Tokyo, Japan; Zeanor T made by Zeon Chemicals L.P., Tokyo Japan; and Topas® made by Celanese A. G., Kronberg Germany. Arton is a poly(bis(cyclopentadiene)) condensate that is a film of a polymer. Alternatively, the flexible plastic substrate can be a polyester. A preferred polyester is an aromatic polyester such as Arylite. Although the substrate can be transparent, translucent or opaque, for most display applications transparent members comprising transparent substrate(s) are preferred. Although various examples of plastic substrates are set forth above, it should be appreciated that the flexible substrate can also be formed from other materials such as flexible glass and ceramic.

The flexible plastic substrate can be reinforced with a hard coating. Typically, the hard coating is an acrylic coating. Such a hard coating typically has a thickness of from 1 to 15 microns, preferably from 2 to 4 microns and can be provided by free radical polymerization, initiated either thermally or by ultraviolet radiation, of an appropriate polymerizable material. Depending on the substrate, different hard coatings can be used. When the substrate is polyester or Arton, a particularly preferred hard coating is the coating known as "Lintec." Lintec contains UV cured polyester acrylate and colloidal silica. When deposited on Arton, it has a surface composition of 35 atom % C, 45 atom % 0, and 20 atom % Si, excluding hydrogen. Another particularly preferred hard coating is the acrylic coating sold under the trademark "Terrapin" by Tekra Corporation, New Berlin, Wis.

The most preferred flexible plastic substrate is a polyester because of its superior mechanical and thermal properties as well as its availability in large quantity at a moderate price.

The particular polyester chosen for use can be a homo-polyester or a co-polyester, or mixtures thereof as desired. The polyester can be crystalline or amorphous or mixtures thereof as desired. Polyesters are normally prepared by the condensation of an organic dicarboxylic acid and an organic diol and, therefore, illustrative examples of useful polyesters will be described herein below in terms of these diol and dicarboxylic acid precursors.

Polyesters which are suitable for use in this invention are those which are derived from the condensation of aromatic, cycloaliphatic, and aliphatic diols with aliphatic, aromatic and cycloaliphatic dicarboxylic acids and may be cycloaliphatic, aliphatic or aromatic polyesters. Exemplary of useful cycloaliphatic, aliphatic and aromatic polyesters which can be utilized in the practice of their invention are poly(ethylene terephthalate), poly(cyclohexlenedimethylene), terephthalate) poly(ethylene dodecate), poly(butylene terephthalate), poly(ethylene naphthalate), poly(ethylene(2, 7-naphthalate)), poly(methaphenylene isophthalate), poly(glycolic acid), poly(ethylene succinate), poly(ethylene adipate), poly(ethylene sebacate), poly(decamethylene azelate), poly(ethylene sebacate), poly(decamethylene adipate), poly (decamethylene sebacate), poly(dimethylpropiolactone), poly(para-hydroxybenzoate) (Ekonol), poly(ethylene oxybenzoate) (A-tell), poly(ethylene isophthalate), poly(tetramethylene terephthalate, poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylene dimethylene terephthalate), (Kodel) (cis), and poly (1,4-cyclohexylene dimethylene terephthalate (Kodel) (trans). Polyester compounds prepared from the condensation of a diol and an aromatic dicarboxylic acid is preferred for use in this invention. Illustrative of such useful aromatic carboxylic acids are terephthalic acid, isophthalic acid and an α-phthalic acid, 1,3-napthalenedicarboxylic acid, 1,4 napthalenedicarboxylic acid, 2,6-napthalenedicarboxylic acid, 2,7-napthalenedicarboxylic acid, 4,4'-diphenyldicarboxylic acid, 4,4'-diphenysulfphone-dicarboxylic acid, 1,1,3-trimethyl-5-carboxy-3-(p-carboxyphenyl)-idane, diphenyl ether 4,4'-dicarboxylic acid, bis-p(carboxy-phenyl)methane, and the like. Of the aforementioned aromatic dicarboxylic acids, those based on a benzene ring (such as terephthalic acid, isophthalic acid, orthophthalic acid) are preferred for use in the practice of this invention. Amongst these preferred acid precursors, terephthalic acid is particularly preferred acid precursor.

Preferred polyesters for use in the practice of this invention include poly(ethylene terephthalate), poly(butylene terephthalate), poly(1,4-cyclohexylene dimethylene terephthalate) and poly(ethylene naphthalate) and copolymers and/or mixtures thereof. Among these polyesters of choice, poly(ethylene terephthalate) is most preferred because of its low cost, high transparency, and low coefficient of thermal expansion.

The aforesaid substrate useful for application in display devices can be planar and/or curved. The curvature of the substrate can be characterized by a radius of curvature, which may have any value. Alternatively, the substrate may be bent so as to form an angle. This angle may be any angle from 0° to 360°, including all angles therebetween and all ranges therebetween. If the substrate is electronically conducting, an insulating material such as a non-conductive polymer may be placed between the substrate and the conducting polymer.

The substrate may be of any thickness, such as, for example. $10^{-8}$ cm to 1 cm including all values in between and all ranges therebetween. Thicker and thinner layers may be used. The substrate need not have a uniform thickness. The preferred shape is square or rectangular, although any shape may be used. Before the substrate is coated with the conducting polymer it may be physically and/or optically patterned, for example by rubbing, by the application of an image, by the application of patterned electrical contact areas, by the presence of one or more colors in distinct regions, by embossing, microembossing, microreplication, etc.

The aforesaid substrate can comprise a single layer or multiple layers according to need. The multiplicity of layers may include any number of auxiliary layers such as antistatic layers, tie layers or adhesion promoting layers, abrasion resistant layers, curl control layers, conveyance layers, barrier layers, splice providing layers, UV absorption layers, optical effect providing layers, such as antireflective and antiglare layers, waterproofing layers, adhesive layers, imaging layers and the like.

The polymer substrate can be formed by any method known in the art such as those involving extrusion, coextrusion, quenching, orientation, heat setting, lamination, coating and solvent casting. It is preferred that the polymer substrate is an oriented sheet formed by any suitable method known in the art, such as by a flat sheet process or a bubble or tubular process. The flat sheet process involves extruding or coextruding the materials of the sheet through a slit die and rapidly quenching the extruded or coextruded web upon a chilled casting drum so that the polymeric component(s) of the sheet are quenched below their solidification temperature.

The quenched sheet is then biaxially oriented by stretching in mutually perpendicular directions at a temperature above the glass transition temperature of the polymer(s). The sheet may be stretched in one direction and then in a second direction or may be simultaneously stretched in both directions. The preferred stretch ratio in any direction is at least 3:1. After the sheet has been stretched, it is heat set by heating to a temperature sufficient to crystallize the polymers while restraining to some degree the sheet against retraction in both directions of stretching.

The polymer sheet may be subjected to any number of coatings and treatments, after extrusion, coextrusion, orientation, etc. or between casting and full orientation, to improve its properties, such as printability, barrier properties, heat-sealability, spliceability, adhesion to other substrates and/or imaging layers. Examples of such coatings can be acrylic coatings for printability, polyvinylidene halide for heat seal properties, etc. Examples of such treatments can be flame, plasma and corona discharge treatment, ultraviolet radiation treatment, ozone treatment and electron beam treatment to improve coatability and adhesion. Further examples of treatments can be calendaring, embossing and patterning to obtain specific effects on the surface of the web. The polymer sheet can be further incorporated in any other suitable substrate by lamination, adhesion, cold or heat sealing, extrusion coating, or any other method known in the art.

The conductive layers of the invention can be formed by any method known in the art. Particularly preferred methods include coating from a suitable liquid medium coating composition by any well known coating method such as air knife coating, gravure coating, hopper coating, roller coating, spray coating, electrochemical coating, inkjet printing, flexographic printing, and the like. The at least one conductive carbon nanotube layer and at least one conductive layer comprising electronically conductive polymer may be applied sequentially or simultaneously.

Alternatively, the conductive layers can be transferred to a receiver member from a donor member by the application of heat and/or pressure. An adhesive layer may be preferably present between the donor member and the receiver member to facilitate transfer. The conductive carbon nanotube layer and conductive layer comprising electronically conductive polymer may be applied simultaneously from a single donor element or sequentially from two separate donor members as described in copending commonly assigned U.S. patent application Ser. Nos. 10/969,889 filed Oct. 21, 2004, Majumdar et al, 11/062,416 filed Feb. 22, 2005, Irvin et al., and 11/022,155, filed Dec. 22, 2004, Majumdar et al.

Another preferred method of forming the conductive layers is by thermal transfer as disclosed in a series of US patents and patent applications, e.g., U.S. Pat. Nos. 6,114,088; 6,140,009; 6,214,520; 6,221,553; 6,582,876; 6,586,153 by Wolk et al.; 6,610,455; 6,582,875; 6,252,621; 2004/0029039 A1; by Tutt et al., 5,171,650 by Ellis et al.; 2004/0065970 A1 by Blanchet-Fincher. Accordingly, it is envisioned that a thermal transfer element comprising a donor substrate and a multi-component transfer unit can be formed wherein the multi-component transfer unit comprises the conductive layers of the invention. Such a transfer unit is fully or partially transferred through the application of heat onto a receiver substrate, thus incorporating the conductive layers of the invention on the receiver substrate.

Besides the conductive layers of the invention, the aforementioned thermal transfer element may comprise a number of other layers. These additional layers may include radiation absorption layer, which can be a light to heat conversion layer, interlayer, release layer, adhesion promoting layer, operational layer (which is used in the operation of a device), non-operational layer (which is not used in the operation of a device but can facilitate, for example, transfer of a transfer layer, protection from damage and/or contact with outside elements).

Thermal transfer of the conductive layers of the invention can be accomplished by the application of directed heat on a selected portion of the thermal transfer element. Heat can be generated using a heating element (e.g., a resistive heating element), converting radiation (e.g., a beam of light) to heat, and/or applying an electrical current to a layer of thermal transfer element to generate heat.

For some specific display applications, such as those involving organic or polymeric light emitting diodes the roughness of the conductive layers can be critical. Typically, a very smooth surface, with low roughness (Ra) is desired for maximizing optical and barrier properties of the coated substrate. Preferred Ra values for the conductive layer of the invention is less than 1000 nm, more preferably less than 100 nm, and most preferably less than 20 nm. However, it is to be understood that if for some application a rougher surface is required higher Ra values can be attained within the scope of this invention, by any means known in the art.

A key criterion of the conductive layers of the invention involves two important characteristics of the conductive layer, namely the transparency and the sheet resistance or surface electrical resistance. As alluded to herein above, the stringent requirement of high transparency and low resistance demanded by modern display devices is extremely difficult to attain with electronically conductive layers. Typically, lower resistance values are obtained by coating thicker layers of the carbon nanotubes or electronically conductive layer which undesirably reduces transparency.

In a particular embodiment of the invention the conductive carbon nanotube layer or electronically conductive polymer layer may be formed into electrode or other array patterns. Useful patterning techniques include: inkjet printing, transfer printing such as lithoplate printing, various dry etching methods such as laser etching and thermal ablation, wet etching methods such as the microlithographic techniques described in WO97/18944 and U.S. Pat. No. 5,976,274, and others.

The multilayer conductive articles of the invention may be incorporated as a transparent member in a display device. The display device typically comprises at least one imageable layer wherein the imageable layer can contain an electronically imageable material. The electronically imageable material can be light emitting or light modulating. Light emitting materials can be inorganic or organic in nature. Particularly preferred are organic light emitting diodes (OLED) or polymeric light emitting diodes (PLED). The light modulating material can be reflective or transmissive. Light modulating materials can be electrochemical, electrophoretic, such as Gyricon particles, electrochromic, or liquid crystals. The liquid crystalline material can be twisted nematic (TN), super-twisted nematic (STN), ferroelectric, magnetic, or chiral nematic liquid crystals. Especially preferred are chiral nematic liquid crystals. The chiral nematic liquid crystals can be polymer dispersed liquid crystals (PDLC). Structures having stacked imaging layers or multiple substrate layers, however, are optional for providing additional advantages in some case.

The multilayer conductive article of the invention, comprising at least one conductive carbon nanotube layer in contact with at least one conductive layer comprising electronically conductive polymer may simply be substituted for any one or more conducting electrodes present in such prior art devices as mentioned above. The present invention preferably has at least one electric lead attached to (in contact with) a conductive layer on the substrate for the application of current, voltage, etc. to said conductive layer (i.e. electronically connected). The lead(s) is/are preferably not in electrical contact with the substrate and may be made of patterned deposited metal, conductive or semiconductive material, such as ITO, may be a simple wire in contact with the conductive layer, and/or conductive paint comprising, for example, a conductive polymer, carbon, and/or metal particles. Devices according to the invention preferably also include a current or a voltage source electronically connected to the conducting electrode through the lead(s). A power source, battery, etc. may be used. One embodiment of the invention is illustrated in FIG. 4 as a display component 60, wherein a substrate 62 is coated with an electronically conductive polymer layer 64, and a carbon nanotube layer 63, which is connected to a power source 66 by means of an electric lead 68.

In a preferred embodiment, the electronically imageable material can be addressed with an electric field and then retain its image after the electric field is removed, a property typically referred to as "bistable". Particularly suitable electronically imageable materials that exhibit "bistability" are electrochemical, electrophoretic, such as Gyricon particles, electrochromic, magnetic, or chiral nematic liquid crystals. Especially preferred are chiral nematic liquid crystals. The chiral nematic liquid crystals can be polymer dispersed liquid crystals (PDLC).

For purpose of illustration of the application of the present invention, the display will be described primarily as a liquid crystal display. However, it is envisioned that the present invention may find utility in a number of other display applications.

Figure 5:
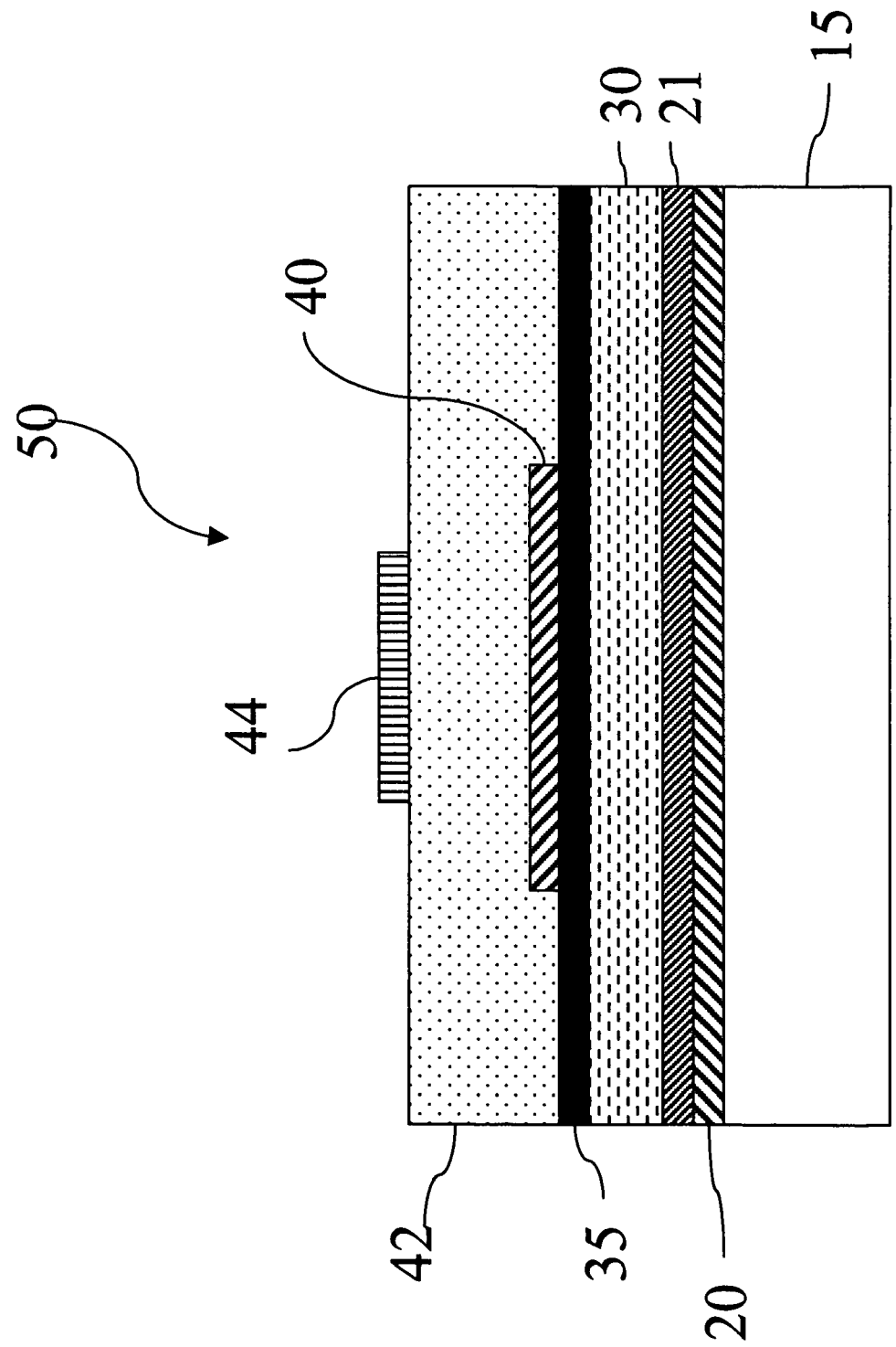
FIG. 5. A schematic of an illustrative polymer dispersed LC display, as per the invention.

As used herein, a "liquid crystal display" (LCD) is a type of flat panel display used in various electronic devices. At a minimum, an LCD comprises a substrate, at least one conductive layer and a liquid crystal layer. LCDs may also comprise two sheets of polarizing material with a liquid crystal solution between the polarizing sheets. The sheets of polarizing material may comprise a substrate of glass or transparent plastic. The LCD may also include functional layers. In one embodiment of an LCD item 50, illustrated in FIG. 5, a transparent, multilayer flexible substrate 15 is coated with an electronically conductive polymer layer 20 and a conductive carbon nanotube layer 21 of the present invention, which may be patterned, onto which is coated the light-modulating liquid crystal layer 30. A second conductive layer 40 that may also comprise the multiple layers of the present invention is applied and overcoated with a dielectric layer 42 to which conductive row contacts 44 are attached, including vias (not shown) that permit interconnection between conductive layers and the conductive row contacts. FIG. 5 shows an optional nanopigmented functional layer 35 applied between the liquid crystal layer 30 and the second conductive layer 40. In a typical matrix-address light-emitting display device, numerous light-emitting devices are formed on a single substrate and arranged in groups in a regular grid pattern. Activation may be by rows and columns.

The liquid crystal (LC) is used as an optical switch. The substrates are usually manufactured with transparent, conductive electrodes, in which electrical "driving" signals are coupled. The driving signals induce an electric field which can cause a phase change or state change in the LC material, the LC exhibiting different light-reflecting characteristics according to its phase and/or state.

Liquid crystals can be nematic (N), chiral nematic (N*), or smectic, depending upon the arrangement of the molecules in the mesophase. Chiral nematic liquid crystal (N*LC) displays are typically reflective, that is, no backlight is needed, and can function without the use of polarizing films or a color filter.

Chiral nematic liquid crystal refers to the type of liquid crystal having finer pitch than that of twisted nematic and super-twisted nematic used in commonly encountered LC devices. Chiral nematic liquid crystals are so named because such liquid crystal formulations are commonly obtained by adding chiral agents to host nematic liquid crystals. Chiral nematic liquid crystals may be used to produce bi-stable or multi-stable displays. These devices have significantly reduced power consumption due to their non-volatile "memory" characteristic. Since such displays do not require a continuous driving circuit to maintain an image, they consume significantly reduced power. Chiral nematic displays are bistable in the absence of a field; the two stable textures are the reflective planar texture and the weakly scattering focal conic texture. In the planar texture, the helical axes of the chiral nematic liquid crystal molecules are substantially perpendicular to the substrate upon which the liquid crystal is disposed. In the focal conic state the helical axes of the liquid crystal molecules are generally randomly oriented. Adjusting the concentration of chiral dopants in the chiral nematic material modulates the pitch length of the mesophase and, thus, the wavelength of radiation reflected. Chiral nematic materials that reflect infrared radiation and ultraviolet have been used for purposes of scientific study. Commercial displays are most often fabricated from chiral nematic materials that reflect visible light. Some known LCD devices include chemically-etched, transparent, conductive layers overlying a glass substrate as disclosed in U.S. Pat. No. 5,667,853.

In one embodiment, a chiral-nematic liquid crystal composition may be dispersed in a continuous matrix. Such materials are referred to as "polymer-dispersed liquid crystal" materials or "PDLC" materials. Such materials can be made by a variety of methods. For example, Doane et al. (Applied Physics Letters, 48, 269 (1986)) disclose a PDLC comprising approximately 0.4 µm droplets of nematic liquid crystal 5CB in a polymer binder. A phase separation method is used for preparing the PDLC. A solution containing monomer and liquid crystal is filled in a display cell and the material is then polymerized. Upon polymerization the liquid crystal becomes immiscible and nucleates to form droplets. West et al. (Applied Physics Letters 63, 1471 (1993)) disclose a PDLC comprising a chiral nematic mixture in a polymer binder. Once again a phase separation method is used for preparing the PDLC. The liquid-crystal material and polymer (a hydroxy functionalized polymethylmethacrylate) along with a cross-linker for the polymer are dissolved in a common organic solvent toluene and coated on a transparent conductive layer on a substrate. A dispersion of the liquid-crystal material in the polymer binder is formed upon evaporation of toluene at high temperature. The phase separation methods of Doane et al. and West et al. require the use of organic solvents that may be objectionable in certain manufacturing environments.

The contrast of the display is degraded if there is more than a substantial monolayer of N*LC domains. The term "substantial monolayer" is defined by the Applicants to mean that, in a direction perpendicular to the plane of the display, there is no more than a single layer of domains sandwiched between the electrodes at most points of the display (or the imaging layer), preferably at 75 percent or more of the points (or area) of the display, most preferably at 90 percent or more of the points (or area) of the display. In other words, at most, only a minor portion (preferably less than 10 percent) of the points (or area) of the display has more than a single domain (two or more domains) between the electrodes in a direction perpendicular to the plane of the display, compared to the amount of points (or area) of the display at which there is only a single domain between the electrodes.

The amount of material needed for a monolayer can be accurately determined by calculation based on individual domain size, assuming a fully closed packed arrangement of domains. (In practice, there may be imperfections in which gaps occur and some unevenness due to overlapping droplets or domains.) On this basis, the calculated amount is preferably less than about 150 percent of the amount needed for monolayer domain coverage, preferably not more than about 125 percent of the amount needed for a monolayer domain coverage, more preferably not more than 110 percent of the amount needed for a monolayer of domains. Furthermore, improved viewing angle and broadband features may be obtained by appropriate choice of differently doped domains based on the geometry of the coated droplet and the Bragg reflection condition.

In a preferred embodiment of the invention, the display device or display sheet has simply a single imaging layer of liquid crystal material along a line perpendicular to the face of the display, preferably a single layer coated on a flexible substrate. Such a structure, as compared to vertically stacked imaging layers each between opposing substrates, is especially advantageous for monochrome shelf labels and the like. Structures having stacked imaging layers, however, are optional for providing additional advantages in some case.

Preferably, the domains are flattened spheres and have on average a thickness substantially less than their length, preferably at least 50% less. More preferably, the domains on average have a thickness (depth) to length ratio of 1:2 to 1:6. The flattening of the domains can be achieved by proper formulation and sufficiently rapid drying of the coating. The domains preferably have an average diameter of 2 to 30 microns. The imaging layer preferably has a thickness of 10 to 150 microns when first coated and 2 to 20 microns when dried.

The flattened domains of liquid crystal material can be defined as having a major axis and a minor axis. In a preferred embodiment of a display or display sheet, the major axis is larger in size than the cell (or imaging layer) thickness for a majority of the domains. Such a dimensional relationship is shown in U.S. Pat. No. 6,061,107.

Modern chiral nematic liquid crystal materials usually include at least one nematic host combined with a chiral dopant. In general, the nematic liquid crystal phase is composed of one or more mesogenic components combined to provide useful composite properties. Many such materials are available commercially. The nematic component of the chiral nematic liquid crystal mixture may be comprised of any suitable nematic liquid crystal mixture or composition having appropriate liquid crystal characteristics. Nematic liquid crystals suitable for use in the present invention are preferably composed of compounds of low molecular weight selected from nematic or nematogenic substances, for example from the known classes of the azoxybenzenes, benzylideneanilines, biphenyls, terphenyls, phenyl or cyclohexyl benzoates, phenyl or cyclohexyl esters of cyclohexanecarboxylic acid; phenyl or cyclohexyl esters of cyclohexylbenzoic acid; phenyl or cyclohexyl esters of cyclohexylcyclohexanecarboxylic acid; cyclohexylphenyl esters of benzoic acid, of cyclohexanecarboxyiic acid and of cyclohexylcyclohexanecarboxylic acid; phenyl cyclohexanes; cyclohexylbiphenyls; phenyl cyclohexylcyclohexanes; cyclohexylcyclohexanes; cyclohexylcyclohexenes; cyclohexylcyclohexylcyclohexenes; 1,4-bis-cyclohexylbenzenes; 4,4-bis-cyclohexylbiphenyls; phenyl- or cyclohexylpyrimidines; phenyl- or cyclohexylpyridines; phenyl- or cyclohexylpyridazines; phenyl- or cyclohexyldioxanes; phenyl- or cyclohexyl-1,3-dithianes; 1,2-diphenylethanes; 1,2-dicyclohexylethanes; 1-phenyl-2-cyclohexylethanes; 1-cyclohexyl-2-(4-phenylcyclohexyl)ethanes; 1-cyclohexyl-2',2-biphenylethanes; 1-phenyl-2-cyclohexylphenylethanes; optionally halogenated stilbenes; benzyl phenyl ethers; tolanes; substituted cinnamic acids and esters; and further classes of nematic or nematogenic substances. The 1,4-phenylene groups in these compounds may also be laterally mono- or difluorinated. The liquid crystalline material of this preferred embodiment is based on the achiral compounds of this type. The most important compounds, that are possible as components of these liquid crystalline materials, can be characterized by the following formula R'-X-Y-Z-R" wherein X and Z, which may be identical or different, are in each case, independently from one another, a bivalent radical from the group formed by -Phe-, -Cyc-, -Phe-Phe-, -Phe-Cyc-, -Cyc-Cyc-, -Pyr-, -Dio-, -B-Phe- and -B-Cyc-; wherein Phe is unsubstituted or fluorine-substituted 1,4-phenylene, Cyc is trans-1,4-cyclohexylene or 1,4-cyclohexenylene, Pyr is pyrimidine-2,5-diyl or pyridine-2,5-diyl, Dio is 1,3-dioxane-2,5-diyl, and B is 2-(trans-1,4-cyclohexyl)ethyl, pyrimidine-2,5-diyl, pyridine-2,5-diyl or 1,3-dioxane-2,5-diyl. Y in these compounds is selected from the following bivalent groups —CH=CH—, —C≡C—, —N=N(O)—, —CH=CY'—, —CH=N(O)—, —CH2-CH2-, —CO—O—, —CH2-O—, —CO—S—, —CH2-S—, —COO-Phe-COO— or a single bond, with Y' being halogen, preferably chlorine, or —CN; R' and R" are, in each case, independently of one another, alkyl, alkenyl, alkoxy, alkenyloxy, alkanoyloxy, alkoxycarbonyl or alkoxycarbonyloxy with 1 to 18, preferably 1 to 12 C atoms, or alternatively one of R' and R" is —F, —CF3, —OCF3, —Cl, —NCS or —CN. In most of these compounds R' and R' are, in each case, independently of each another, alkyl, alkenyl or alkoxy with different chain length, wherein the sum of C atoms in nematic media generally is between 2 and 9, preferably between 2 and 7. The nematic liquid crystal phases typically consist of 2 to 20, preferably 2 to 15 components. The above list of materials is not intended to be exhaustive or limiting. The lists disclose a variety of representative materials suitable for use or mixtures, which comprise the active element in electro-optic liquid crystal compositions.

Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bi-stability and gray scale memory. The chiral nematic liquid crystal is typically a mixture of nematic liquid crystal and chiral material in an amount sufficient to produce the desired pitch length. Suitable commercial nematic liquid crystals include, for example, E7, E44, E48, E31, E80, BL087, BL101, ZLI-3308, ZLI-3273, ZLI-5048-000, ZLI-5049-100, ZLI-5100-100, ZLI-5800-000, MLC-6041-100.TL202, TL203, TL204 and TL205 manufactured by E. Merck (Darmstadt, Germany). Although nematic liquid crystals having positive dielectric anisotropy, and especially cyanobiphenyls, are preferred, virtually any nematic liquid crystal known in the art, including those having negative dielectric anisotropy should be suitable for use in the invention. Other nematic materials may also be suitable for use in the present invention as would be appreciated by those skilled in the art.

Chiral Dopant

The chiral dopant added to the nematic mixture to induce the helical twisting of the mesophase, thereby allowing reflection of visible light, can be of any useful structural class. The choice of dopant depends upon several characteristics including among others its chemical compatibility with the nematic host, helical twisting power, temperature sensitivity, and light fastness. Many chiral dopant classes are known in the art: e.g., G. Gottarelli and G. Spada, Mol. Cryst. Liq. Crys., 123, 377 (1985); G. Spada and G. Proni, Enantiomer, 3, 301 (1998) and references therein. Typical well-known dopant classes include 1,1-binaphthol derivatives; isosorbide (D-1) and similar isomannide esters as disclosed in U.S. Pat. No. 6,217,792; TADDOL derivatives (D-2) as disclosed in U.S. Pat. No. 6,099,751; and the pending spiroindanes esters (D-3) as disclosed in U.S. patent application Ser. No. 10/651,692 by T. Welter et al., filed Aug. 29, 2003, titled "Chiral Compounds And Compositions Containing The Same,".

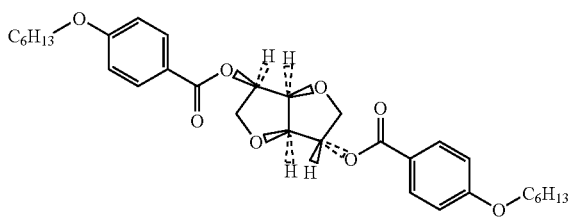

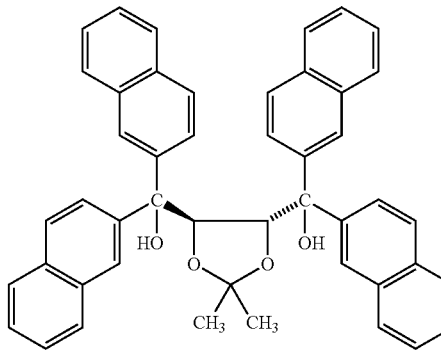

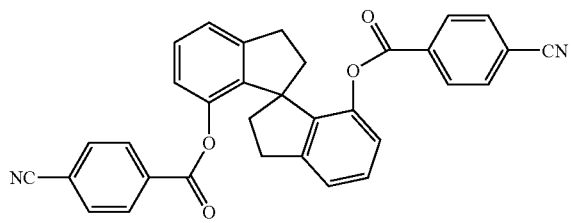

The pitch length of the liquid crystal materials may be adjusted based upon the following equation (1):

$$\lambda max = nav\, p0$$

where $\lambda max$ is the peak reflection wavelength, that is, the wavelength at which reflectance is a maximum, nav is the average index of refraction of the liquid crystal material, and p0 is the natural pitch length of the chiral nematic helix. Definitions of chiral nematic helix and pitch length and methods of its measurement, are known to those skilled in the art such as can be found in the book, Blinov, L. M., Electro-optical and Magneto-Optical Properties of Liquid Crystals, John Wiley & Sons Ltd. 1983. The pitch length is modified by adjusting the concentration of the chiral material in the liquid crystal material. For most concentrations of chiral dopants, the pitch length induced by the dopant is inversely proportional to the concentration of the dopant. The proportionality constant is given by the following equation (2):

$$p0 = 1/(HTP \cdot c)$$

where c is the concentration of the chiral dopant and HTP (as termed □ in some references) is the proportionality constant.

For some applications, it is desired to have LC mixtures that exhibit a strong helical twist and thereby a short pitch length. For example in liquid crystalline mixtures that are used in selectively reflecting chiral nematic displays, the pitch has to be selected such that the maximum of the wavelength reflected by the chiral nematic helix is in the range of visible light. Other possible applications are polymer films with a chiral liquid crystalline phase for optical elements, such as chiral nematic broadband polarizers, filter arrays, or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

There are alternative display technologies to LCDs that may be used, for example, in flat panel displays. A notable example is organic or polymer light emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. Alternatively, a plurality of these OLED devices may be assembled such to form a solid state lighting display device.

A light emitting layer of a luminescent organic solid, as well as adjacent semiconductor layers, are sandwiched between an anode and a cathode. The semiconductor layers may be hole injecting and electron injecting layers. PLEDs may be considered a subspecies of OLEDs in which the luminescent organic material is a polymer. The light emitting layers may be selected from any of a multitude of light emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy) pyridine ketones, bis-phosphonates, divalent metal maleonitriledithiolate complexes, molecular charge transfer complexes, rare earth mixed chelates, (5-hydroxy) quinoxaline metal complexes, aluminum tris-quinolates, and polymers such as poly(p-phenylenevinylene), poly(dialkoxyphenylenevinylene), poly (thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron-injecting layer and holes from the hole-injecting layer are injected into the light-emitting layer; they recombine, emitting light. OLEDs and PLEDs are disclosed in the following United States patents: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix-address light-emitting display device, numerous light-emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode may be formed over the organic layers. For example, disclosed in U.S. Pat. No. 5,703,436 to Forrest et al, transparent indium tin oxide (ITO) is used as the hole-injecting electrode, and a Mg—Ag—ITO electrode layer is used for electron injection.

The present invention can be employed in most OLED device configurations as an electrode, preferably as an anode. These include very simple structures comprising a single anode and cathode to more complex devices, such as passive-matrix displays comprised of orthogonal arrays of anodes and cathodes to form pixels, and active-matrix displays where each pixel is controlled independently, for example, with thin film transistors (TFTs).

Figure 6:
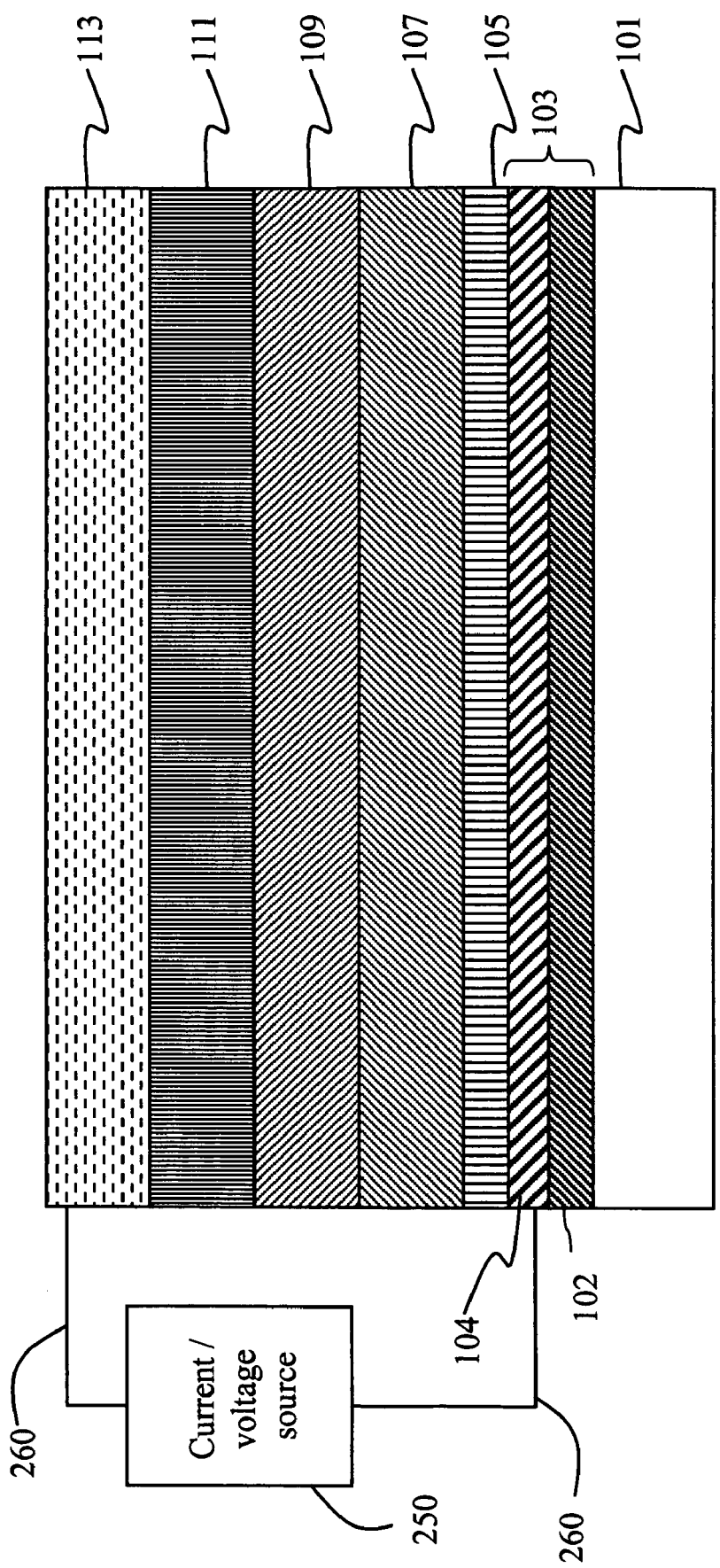
FIG. 6. A schematic of an OLED based display, as per the invention.

There are numerous configurations of the organic layers wherein the present invention can be successfully practiced. A typical structure is shown in FIG. 6 and is comprised of a substrate 101, an anode composed of the conductive multi-layer 103 of the invention comprising an electronically conductive polymer layer 102 and a conductive carbon nanotube layer 104, a hole-injecting layer 105, a hole-transporting layer 107, a light-emitting layer 109, an electron-transporting layer 111, and a cathode 113. These layers are described in more detail below. Note that the substrate may alternatively be located adjacent to the cathode, or the substrate may actually constitute the anode or cathode. The organic layers between the anode and cathode are conveniently referred to as the organic electroluminescent (EL) element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

When EL emission is viewed through anode 103, the anode should be transparent or substantially transparent to the emission of interest. Thus, the transparency of this invention is critical for such OLED display devices. Common transparent anode materials used in OLED display devices are indium-tin oxide (ITO), indium-zinc oxide (IZO) and tin oxide, but other metal oxides can work including, but not limited to, alumi-num- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are generally immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity. It is hoped that the conductive film will have acceptable surface roughness as a result of the film forming capabilities of the conductive polymer, pedot.

Another application of the invention is envisioned for touch screens. Touch screens are widely used in conventional CRTs and in flat-panel display devices in computers and in particular with portable computers. The present invention can be applied as a transparent conductive member in any of the touch screens known in the art, including but not limited to those disclosed in U.S. Pat. Appl. Pub. 2003/0170456 A1; 2003/0170492 A1; U.S. Pat. No. 5,738,934; and WO 00/39835. In particular, the present invention may be applied to resistive and capacitive touch screens, both of which rely on thin, conductive, highly-transparent electrodes having a high durability.

Figure 7:
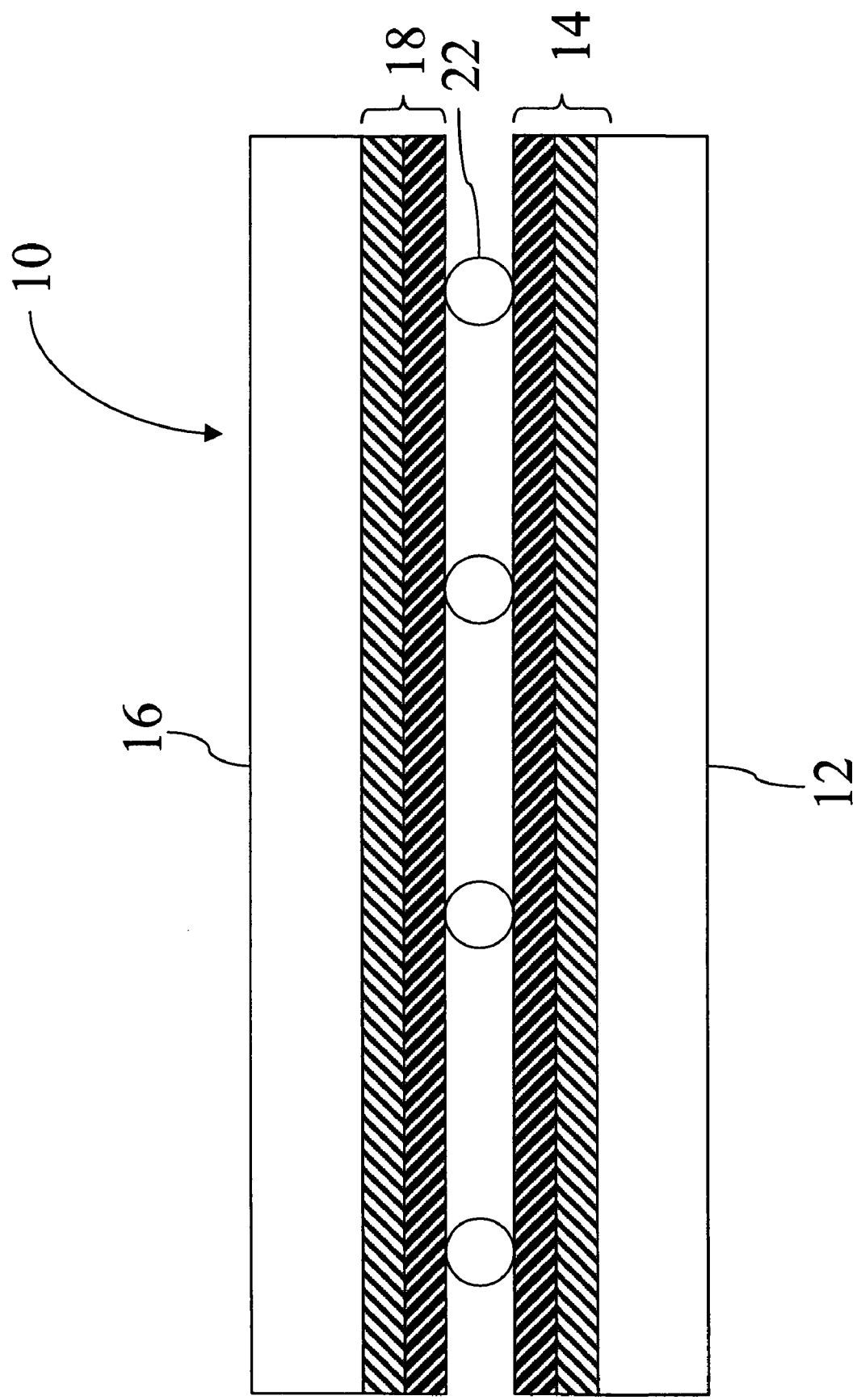
FIG. 7. A schematic of an illustrative resistive-type touch screen, as per the invention.
Figure 8:
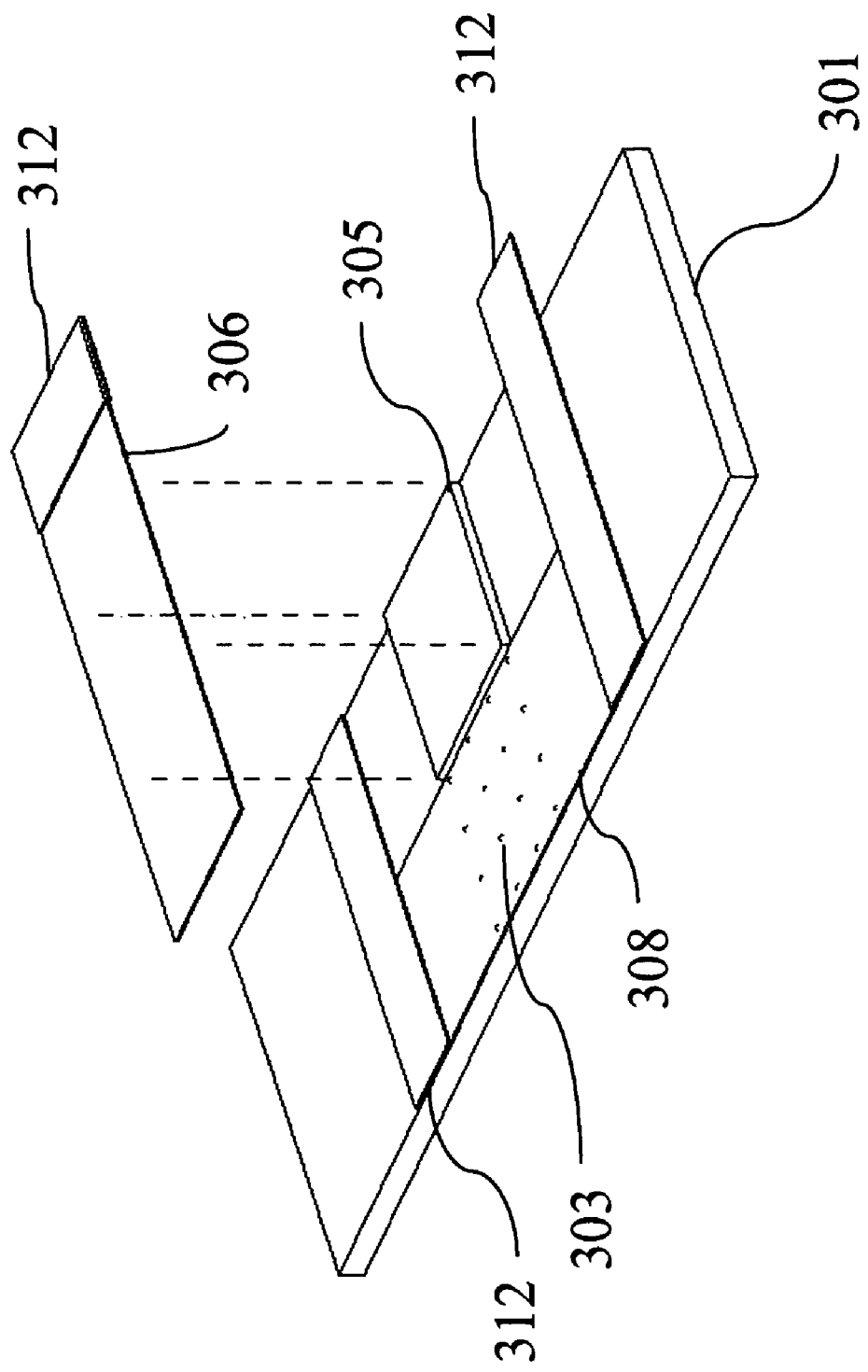
FIG. 8. An exploded view showing the touchscreen fabricated in this invention for testing of single and multilayer electrodes of the instant invention.

FIG. 7 shows a multilayered item 10 for a resistive-type touch screen of the invention including a transparent substrate 12, having a first conductive multilayer 14. A flexible transparent cover sheet 16 includes second conductive multilayer 18 that is physically separated from the first conductive multilayer 14 by spacer elements 22. Wherein each conductive multilayer comprises an electronically conductive polymer layer in contact with a conductive carbon nanotubes layer. A voltage is developed across the conductive multilayers. The conductive multilayers 14 and 18 have a resistance selected to optimize power usage and position sensing accuracy. Deformation of the flexible cover sheet 16 by an external object such as a finger or stylus causes the second conductive multilayers 18 to make electrical contact with first conductive multilayers 14, thereby transferring a voltage between the conductive layers. The magnitude of this voltage is measured through connectors (not shown) connected to metal conductive patterns (not shown) formed on the edges of conductive multilayers 18 and 14 to locate the position of the deforming object.

EXAMPLES

The following non-limiting examples further describe the practice of the instant invention.

TABLE I

Examples of Single and Multilayer Conductor

| Coating ID | Conductor Type | Substrate Type | # of Layers | Sheet Resistant (ohms/ square) | Coating Composition Used |
|---|---|---|---|---|---|
| A | Bekaert ITO | 102 um PET | 1 | 300 | NA |
| B | Keytec ITO | 203 um PET | 1 | 400 | NA |
| C | 344 mg/m² Baytron P AG | 102 um PET | 1 | 438 | I |
| D | 344 mg/m² Baytron P AG | 102 um | 1 | 463 | H |
| E | First layer 172 mg/m² Baytron P AG with 8 mg/m² SWCNT 2$^{nd}$ layer | 102 um PET | 2 | 775 | H first, M second |
| F | First layer 344 mg/m² Baytron P AG with 8 mg/m² SWCNT 2$^{nd}$ layer | 102 um | 2 | 470 | H first, M second |

Coatings A & B were supplied by the vendors Bekaert and Keytec, respectively. The Bekaert ITO is coated onto a 102 um PET substrate. The Keytec sample had a coating on the opposite surface of the ITO on PET. The PET used in the Keytec sample is a 203 um substrate.

Coatings C, D, E and F were produced as follows. The following ingredients were used to form the coating composition for forming the multilayer examples and single layer comparative examples:

Ingredients for Coating Composition
(a) Baytron P AG: aqueous dispersion of electronically conductive polythiophene and polyanion, namely, poly(3,4-ethylene dioxythiophene styrene sulfonate), supplied by H. C. Starck;
(b) TX-100: nonionic surfactant coating aid supplied by Rohm & Haas;
(c) Ethanol;
(d) diethylene glycol: conductivity enhancing agent supplied by Aldrich;
(e) Silquest A 187: 3-glycidoxy-propyltrimethyoxysilane supplied by Crompton Corporation and
(f) SWCNTs: P3 swcnt product supplied by Carbon Solutions The following coating compositions were prepared for coating suitable substrates to form the multilayer conductor examples:

| Coating composition H | |
|---|---|
| Baytron P AG (1.3% active in aqueous) | 266 g |
| TX-100 | 1.5 g |
| Diethylene glycol | 12 g |
| Silquest A 187 | 5.4 g |
| High purity water | 28.47 g |
| Coating composition I | |
| Baytron P AG (1.3% active in aqueous) | 266 g |
| TX-100 | 1.5 g |
| Diethylene glycol | 12 g |
| High purity water | 33.87 g |
| Coating composition M | |
| P3 SWCNT - 0.075 wt % in water | |
| TX-100 - 0.015 wt % in water | |
| Ethanol - 25 wt % in water | |
| Balance high purity water | |

The substrate used was polyethylene terephthalate (PET). The PET substrate was photographic grade with a thickness of 102 μm and surface roughness Ra of 0.5 nm. On the coating side (frontside) of the PET a thin vinylidene chloride copolymer primer layer was applied at a thickness of 80 nm. The coating composition H or I was applied to the frontside surface of the substrate by a hopper at different wet coverages to give dry coverages of Baytron P AG of between 170 mg/m² and 350 mg/m², and each coating was dried at 82° C. for five minutes. When appropriate, in a second pass, coating composition M was applied over the dried Baytron P AG coating (previously deposited by coating composition H) at a single wet coverage to give a dry coverage of SWCNT of 8 mg/m². In this manner, examples of multilayer conductors were created as per the instant invention, wherein conductive layers having different dry coverage of electronically conductive Baytron P AG were coated on the surface of the substrate in one layer and a second layer of SWCNT was applied over the Baytron P AG. The sheet resistance, $R_S$, (ohms/square) of the coatings was measured by a 4-point electrical probe.

In order to evaluate the robustness of the multilayer conductors of the instant invention, small touchscreens were created and tested as described below.

Turning to FIG. 6 Single and Multilayer conductor material combinations were evaluated for mechanical robustness by constructing a single pole-single throw touchscreen as follows:

A 1.27 cm×3.8 cm "bottom" (device side) conductive coating 308 on flexible substrate was cut from a larger coated sheet. The bottom conductive coating 308 was attached, conductive side up, along one long edge of a 25 mm×75 mm glass microscope slide 301. The bottom conductive coating 308 was retained by (2) 3.8 cm lengths of copper foil 312 tape (3M 1181 EMI Shielding Tape) applied across the 1.27 cm ends of the film strip and extending beyond the 2.5 cm dimension of the slide. The excess tape was folded back on itself to form an attachment tab for electrical connection.

Sixteen spacer dots 303 of non-critical dimension were applied in a 4×4 matrix over the central 1.27 cm×1.27 cm square area of the bottom conductor. Spacer dot 303 dimensions can be called out as 0.1-1.0 mm diameter, preferably 0.1-0.3 mm diameter for uniformity of actuation force. Dots were comprised of epoxy (Devcon No. 14250) applied by hand using a pointed applicator. A 1.27 cm square of non-conducting double sided tape 305 (Polyken) was applied to the glass slide adjacent to the spacer dot matrix.

A 1.27 cm×3.8 cm strip of "top" (touch side) conductive coating 306 on flexible substrate was attached, conductive side down, over the double sided tape to form a "T" arrangement with one end of the strip covering the spacer dot array and the other end extending beyond the 2.54 cm dimension of the glass slide. A 2.54 cm length of conductive copper foil 312 tape was wrapped around the overhanging top conductor to form an electrical attachment.

For all of the Touchscreens produced, the top and bottom electrodes were of the same material and layer structure. A line of silver conducting paint (Ernest Fullam No. 14810) was applied across the copper tape/conductor layer interfaces to augment the conductive adhesive of the foil tape.

Single Point Actuation Testing Method

Completed touchscreens were placed in the stationary nest of a test apparatus consisting of a brushless linear motor and force mode motion control. A polyurethane 0.79 cm spherical radius hemisphere switch actuating "finger" (McMaster-Carr #95495K1) is mounted to a load cell, which is in turn mounted to the moving linear motor stage. The finger was pressed against the switch with a force profile consisting of zero force for 125 mS, a linear ramp to peak force over 125 mS, a hold at peak force for 125 mS, and a linear load reduction over 125 mS. The loading pattern was repeated continuously at 2 actuations/second for the duration of the test. Peak force was set for 200-300 grams force. The touchscreen was electrically loaded by supplying a regulated 5V differential between the top and bottom conductors. At the mid point of the peak force period, the connections to the test device were electronically switched to force current in the reverse direction during the second half of the actuation cycle. Current flow through the touchscreen was monitored as a function of time and actuation force.

The touchscreen was considered to make and break actuation at a resistance of or below 12 kOhms. The data recorded were on-state resistance and the force required to achieve an on state e.g. to make a switch in state. A touchscreen was considered to fail when routinely exceeding 12 kOhms on-state resistance.

Comparative Example 1

Single Layer ITO Conductor Touchscreen

Figure 9:
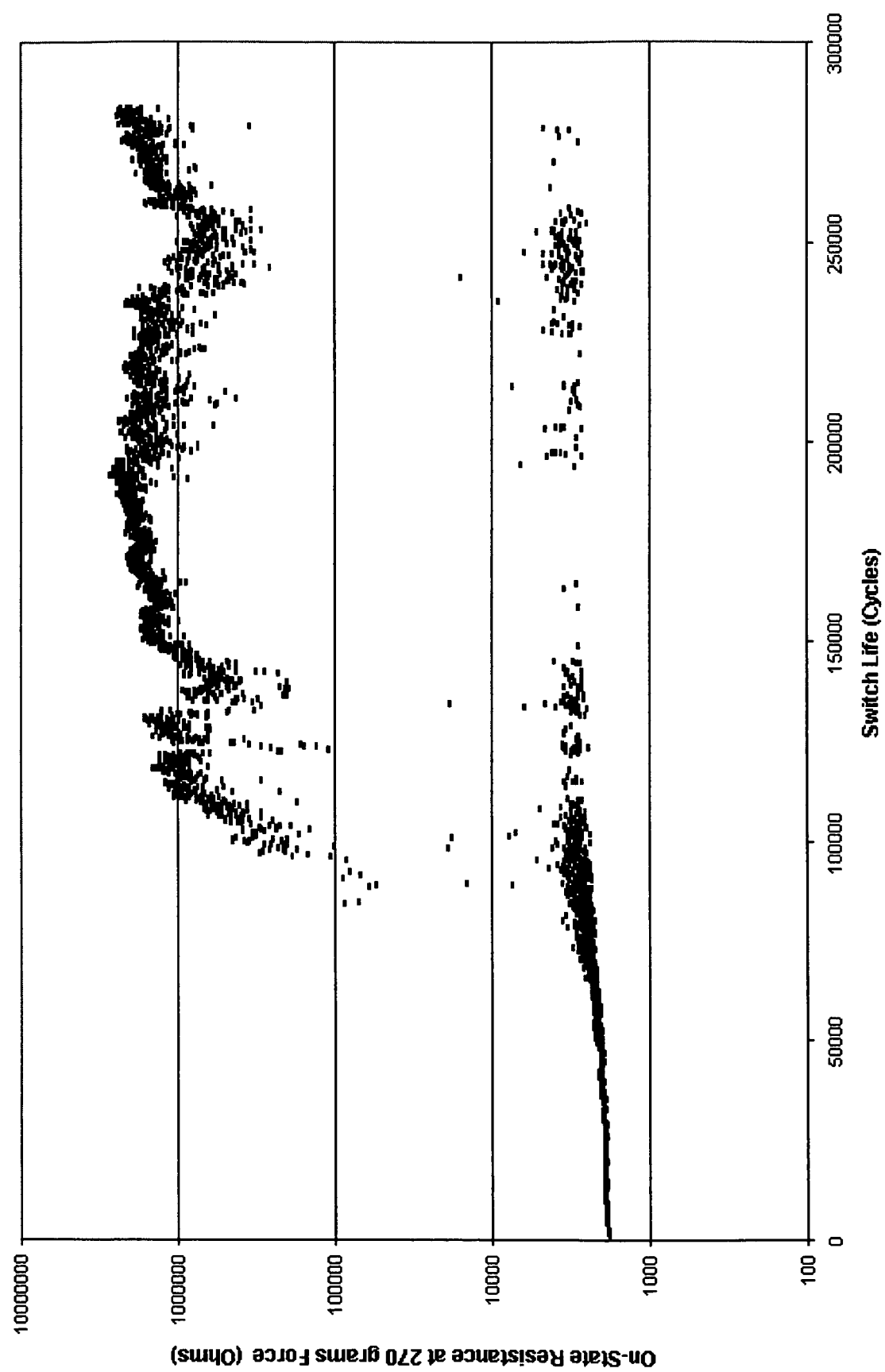
FIG. 9. shows, based on the results of Comparative Example 1 below, the on-state resistance profile as a function of single point actuations for a single layer Bekaert ITO touch switch.
Figure 10:
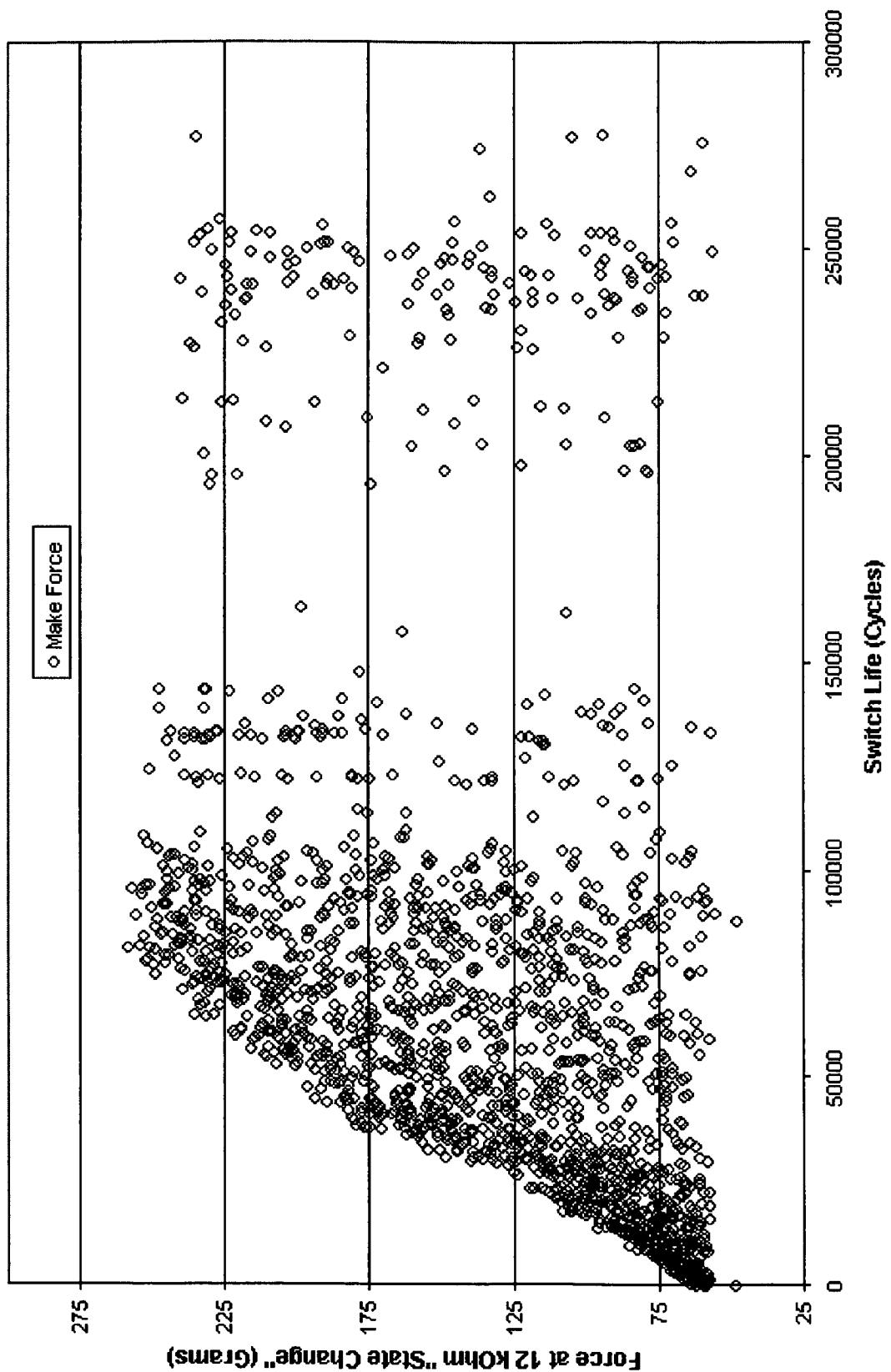
FIG. 10. shows, based on the results of Comparative Example 1 below, the force to actuate the touchswitch as a function of single point actuations for single layer of Bekaert ITO.

A touchscreen was constructed using Coating A from Table I (Bekaert ITO—Lot #5189376). The single point actuation testing was performed and gave the results indicated in FIGS. 9 and 10 below. The single layer of Bekaert ITO began to show significant changes in force to actuate as early as completing 10,000 single point actuations (SPA). The on-state resistance showed significant deviation as early as 85,000 SPA. At 88,000 SPA, the single layer of Bekaert ITO routinely exceeded an on-state resistance of 12,000 ohms. Addtionally, by 88,000 SPA the actuation force is highly scattered and not stable. It is clear from the figures that as the number of actuations increase, the reliability of the touchscreen decreases as evidenced by the significant scatter in the data which corresponds to higher forces required to actuate and increasing on-state resistance which are not desirable. Additionally, the scattered data illustrates potential problems with resolution of point selection.

Comparative Example 2

Single Layer Baytron P AG Conductor Touchscreen

Figure 11:
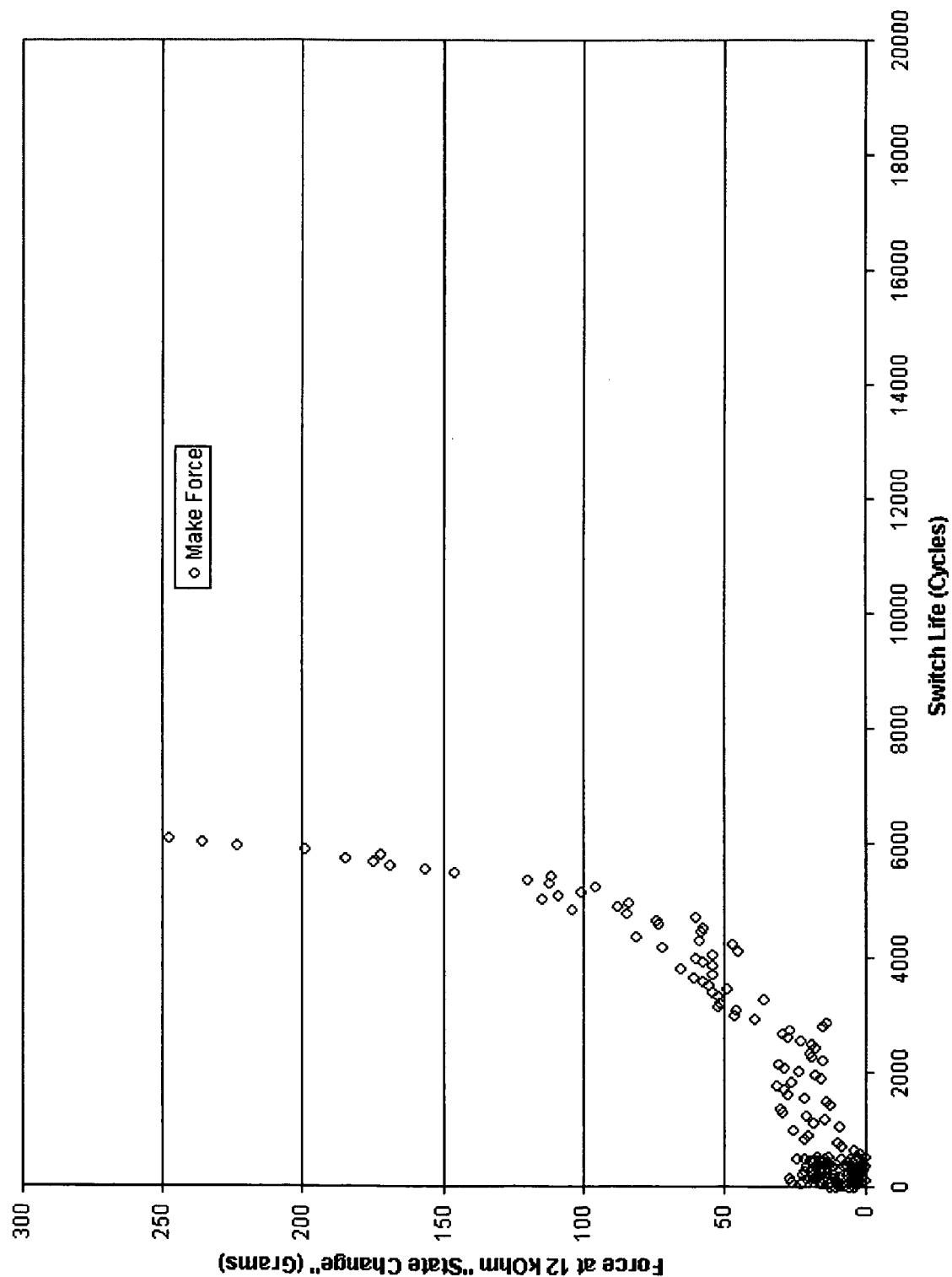
FIG. 11. shows, based on the results of Comparative Example 2 below, the force to actuate the touchswitch as a function of single point actuations for single layer of Baytron P AG (PEDOT/PSS).
Figure 12:
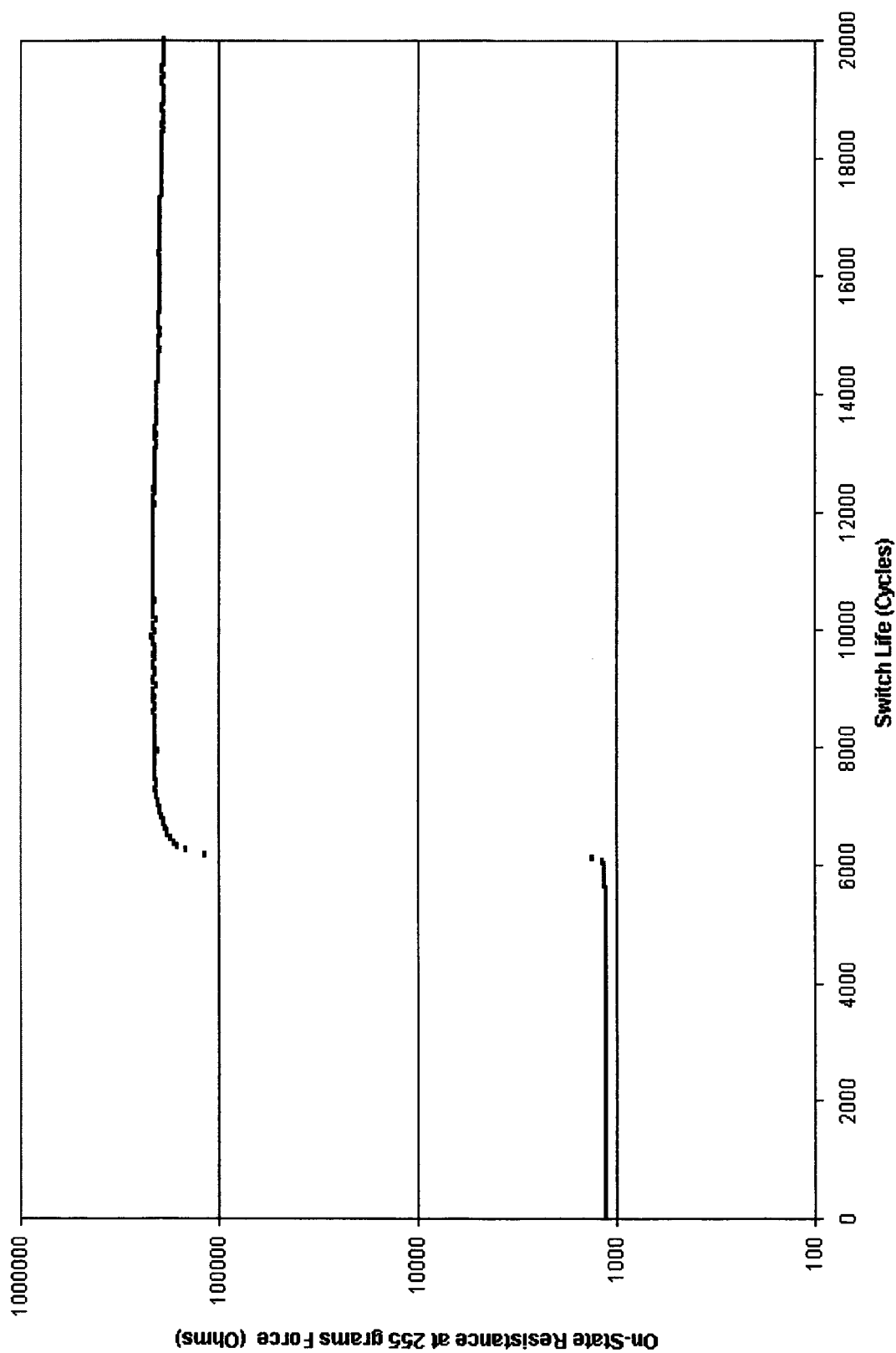
FIG. 12. shows, based on the results of Comparative Example 2 below, the on-state resistance profile as a function of single point actuations for single layer conductor Baytron P AG Touch Switch.

A touchscreen was constructed using Coating C from Table I (344 mg/m$^2$ Baytron P AG). The SPA testing was performed and gave the results indicated in FIGS. 11 and 12 below. The single layer of Baytron P AG began to show significant changes in force to actuate as early as completing 3,000 single point actuations (SPA). The on-state resistance showed significant deviation as early as 6,000 SPA. At 6,000 SPA, the single layer of Baytron P AG permanently exceeded an on-state resistance of 12,000 ohms, reaching a value of 100,000+ ohms. Addtionally, by 6,000 SPA the actuation force experienced an exponential increase and failed shortly thereafter. It is clear from the figures that as the number of actuations increase, the reliability of the single layer Baytron P AG based touchscreen decreases as evidenced by the significant scatter in the data which corresponds to higher forces required to actuate and increasing on-state resistance which are not desirable. Additionally, the scattered data illustrates potential problems with resolution of point selection.

Comparative Example 3

Single Layer Baytron P AG (Containing Crosslinking Agent) Conductor Touchscreen

A touchscreen was constructed using Coating D from Table I (344 mg/m$^2$ Baytron P AG w/Silquest A187). The SPA testing was performed. This touchscreen experienced similar on-state resistance and actuation force profiles as Comparative Example 2 and failed after 17,000 SPA. It is clear that as the number of actuations increase, the reliability of the single layer Baytron P AG with hardening agent based touchscreen decreases as evidenced by the significant scatter in the data which corresponds to higher forces required to actuate and increasing on-state resistance which are not desirable. Additionally, the scattered data illustrates potential problems with resolution of point selection.

Comparative Example 4

Single Layer Keytec ITO Conductor Touchscreen

Figure 13:
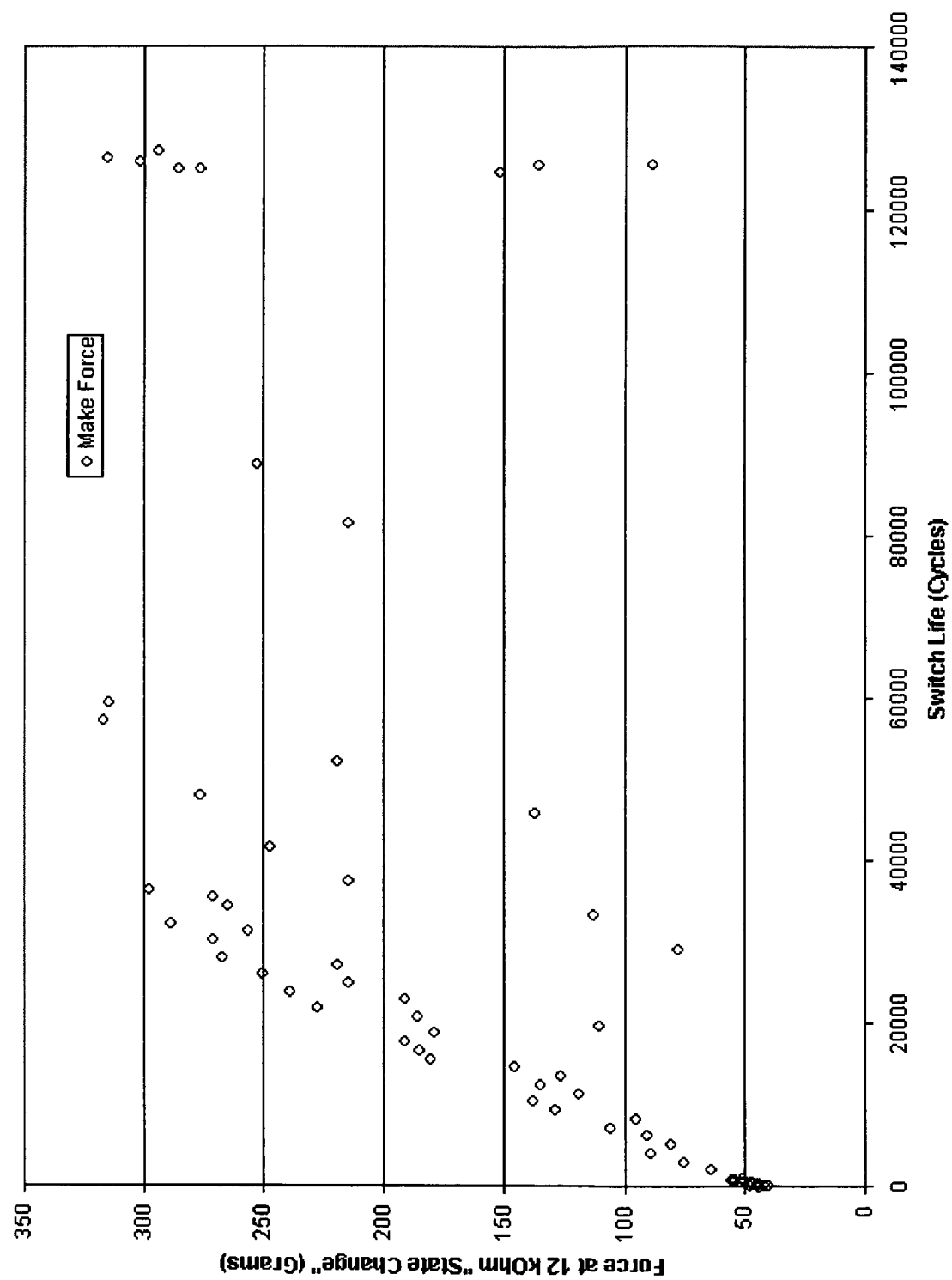
FIG. 13. shows, based on the results of Comparative Example 3 below, the force to actuate the touchswitch as a function of single point actuations for single layer of Keytec ITO.
Figure 14:
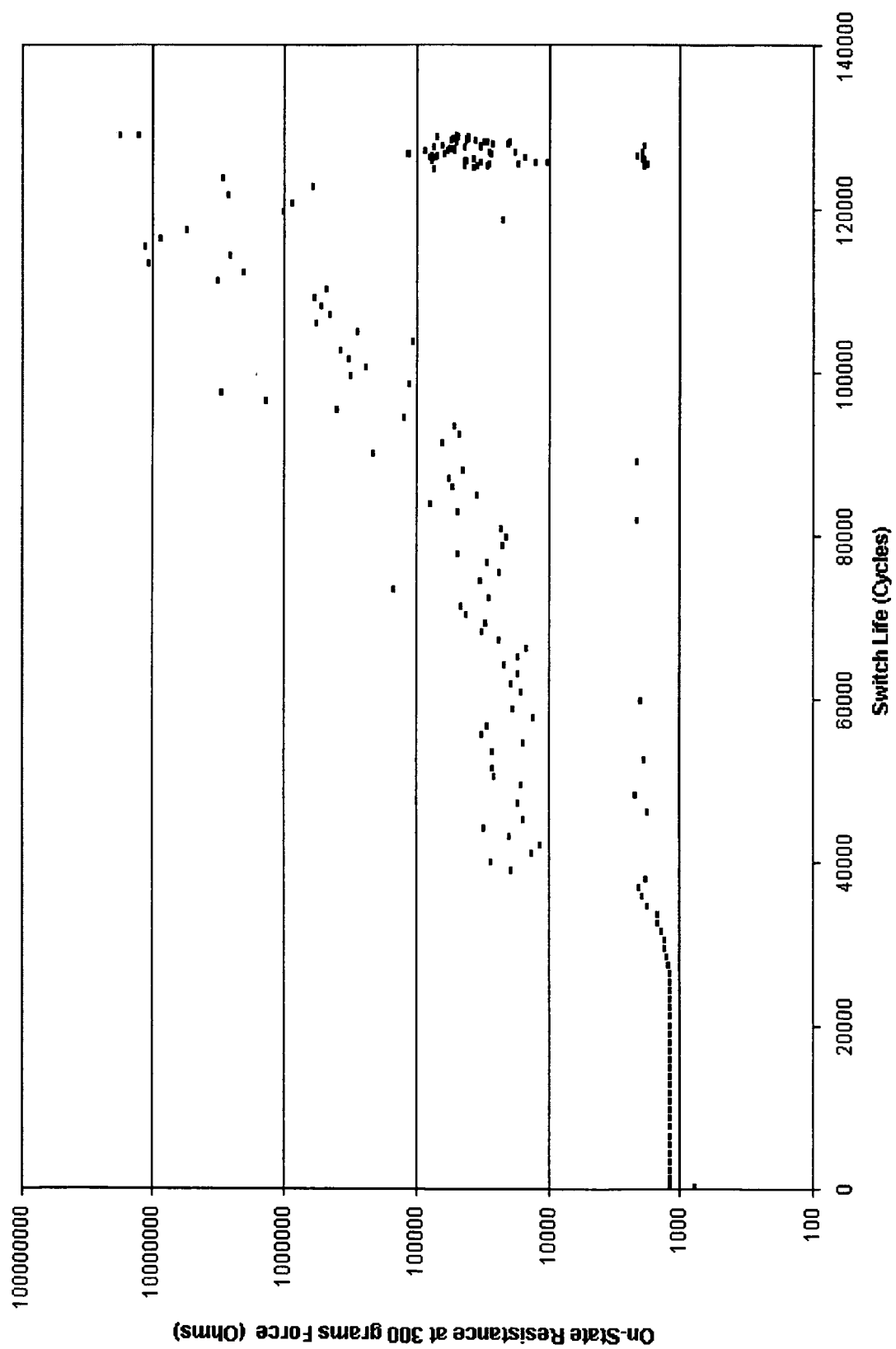
FIG. 14. shows, based on the results of Comparative Example 3 below, the on-state resistance profile as a function of single point actuations for single layer conductor Keytec ITO Touch Switch.

A touchscreen was constructed using Coating B from Table I (400 ohm/square Keytec ITO). The SPA testing was performed and gave the results indicated in FIGS. 13 and 14 below. The single layer of Keytec ITO had a linear increase in the force to actuate and began to show significant changes in force to actuate as early as completing 25,000 SPA. The on-state resistance showed significant deviation as early as 35,000 SPA. At 38,000 SPA, the single layer of Keytec ITO permanently exceeded an on-state resistance of 12,000 ohms, reaching a value of 13,000+ohms and continued to increase to values as high as 10,000,000 ohms. Additionally, by 30,000 SPA the actuation force experienced an exponential increase and failed shortly thereafter with significant scatter in the force to actuate. It is clear from the figures that as the number of actuations increase, the reliability of the single layer Keytec ITO based touchscreen decreases as evidenced by the significant scatter in the data which corresponds to higher forces required to actuate and increasing on-state resistance which are not desirable. Additionally, the scattered data illustrates potential problems with resolution of point selection.

Instant Invention Example 1

Figure 15:
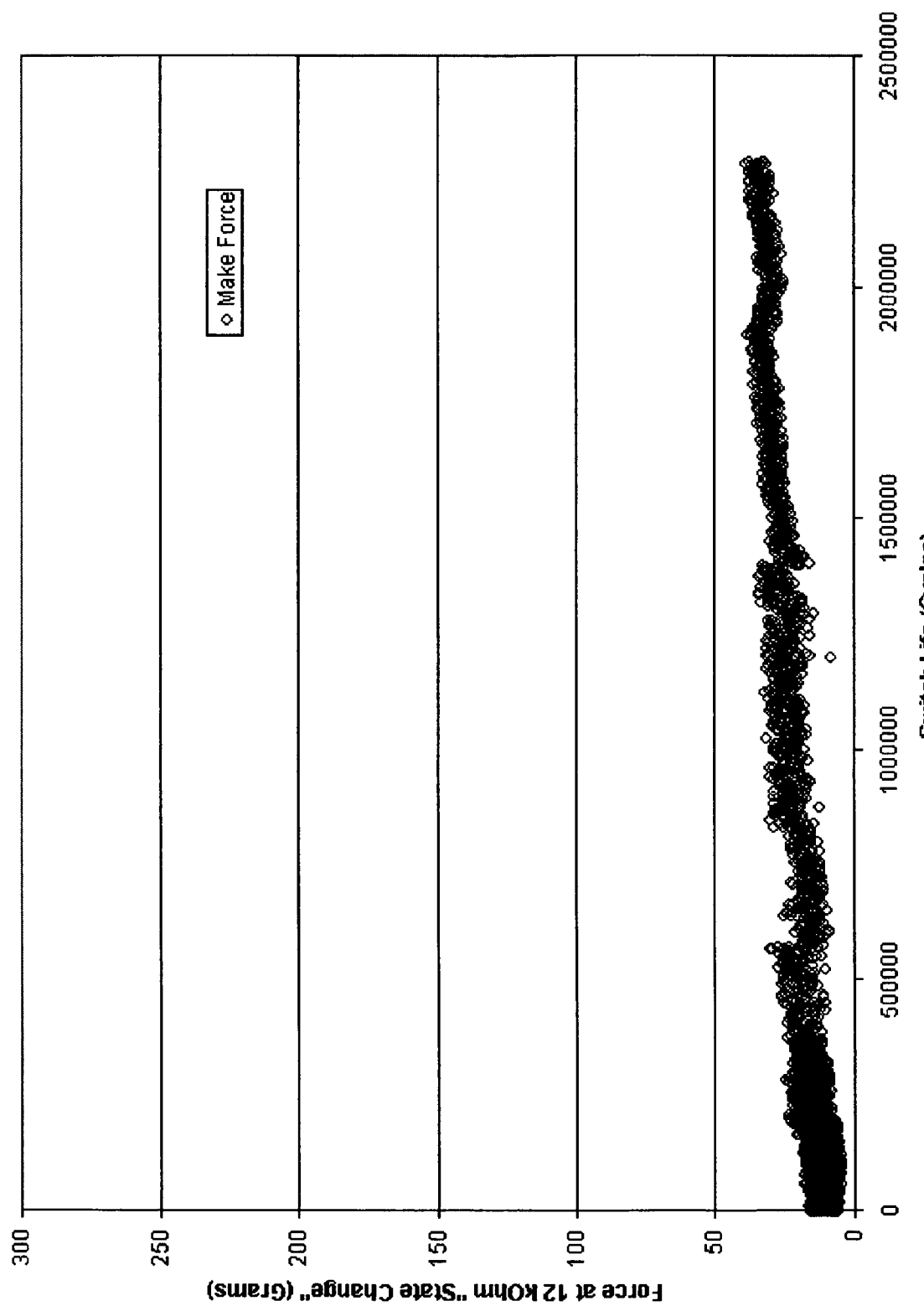
FIG. 15. shows, based on the results of Instant Invention Example 1 below, the force to actuate the touchswitch as a function of single point actuations for multilayer conductor (Baytron P AG bottom, SWCNT top) as per the instant invention.
Figure 16:
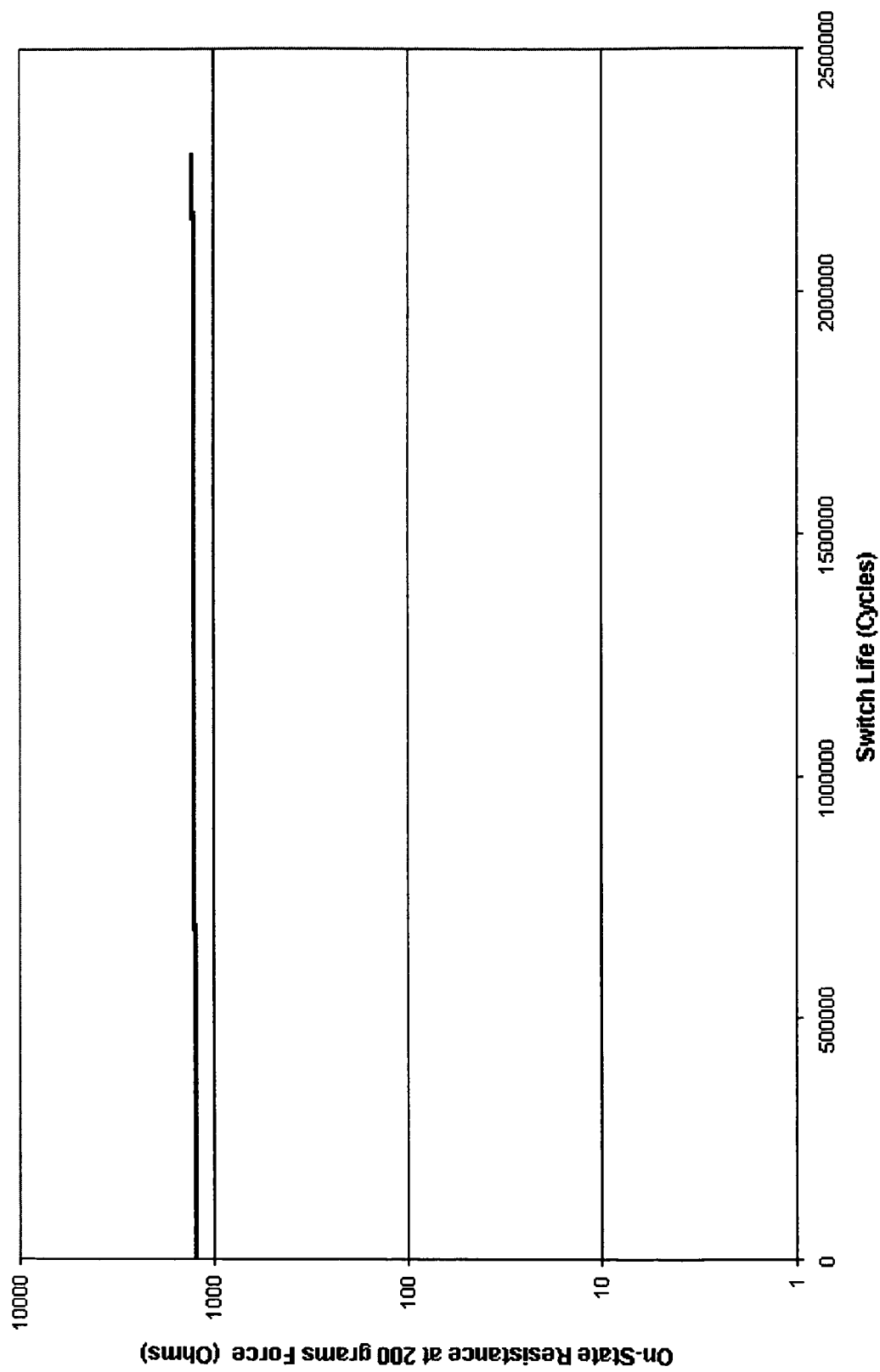
FIG. 16. shows, based on the results of Instant Invention Example 1 below, the on-state resistance profile as a function of single point actuations for multilayer conductor (Baytron P AG bottom, SWCNT top) Touch Switch as per the instant invention.

Multilayer Baytron P AG (1$^{st}$ Layer):SWCNT (Exposed Layer) Conductor Touchscreen A touchscreen was constructed using Coating F from Table I (First layer 344 mg/m2 Baytron P AG with 8 mg/m² P3 SWCNT 2$^{nd}$ layer). The SPA testing was performed and gave the results indicated in FIGS. 15 and 16 below. As can be seen by the results, the touchscreen of this invention was capable of greater than 500,000 SPA and had an essentially steady force to actuate for over 2.27 million SPA. The on-state resistance was steady over 2.27 Million SPA. The on-state resistance changes from approximately 1225 ohms to 1270 ohms over the whole test of 2.27 million SPA. The touchscreen of the invention had a force to actuate that changed by less than 40 percent (~14 g to ~19 g) at more than 500,000 SPA. The force to actuate only changed from approximately 14 g to 30 g over the 2.27 Million SPA. With such a minimal change in force to actuate over 1 Million actuations, the force required to activate the touchscreen doesn't change which manifests as a very reliable, robust, and facile device during operation.

It is surprising and clearly obvious that the instant invention gives significant improvements in robustness as demonstrated above. The SPA for this invention has a steady on-state resistance and essentially steady force to actuate. The fact that the instant invention can sustain significantly more actuations than the comparative example touchscreens without failing and/or noticeable change in operation is important due to the improved reliability of the instant invention touchscreen. For instance, as the force to actuate increases for a touchscreen (use a cellphone with a touchscreen component as example) over time it will be increasingly difficult to select certain points on the touchscreen whereas the instant invention clearly would not suffer such problems. It is apparent that the exemplary embodiment can provide drastically enhanced conductor and/or electrode robustness.

The invention has been described in detail with particular reference to certain preferred embodiments thereof, but it will be understood that variations and modifications can be effected within the spirit and scope of the invention.

PARTS LIST

| | |
|---|---|
| 10 | item for resistive-type touchscreen |
| 12 | transparent substrate |
| 14 | first conductive multilayer |
| 15 | flexible substrate |
| 16 | transparent cover sheet |
| 18 | second conductive multilayer |
| 20 | electronically conductive polymer layer |
| 21 | conductive carbon nanotube layer |

-continued

PARTS LIST

| | |
|---|---|
| 22 | spacer element |
| 30 | light-modulating liquid crystal layer |
| 35 | nanopigmented functional layer |
| 40 | second conductive layer |
| 42 | dielectric layer |
| 44 | conductive row contacts |
| 50 | LCD item |
| 60 | display component |
| 62 | substrate |
| 63 | conductive carbon nanotube layer |
| 64 | electronically conductive polymer layer |
| 66 | power source |
| 68 | electric lead |
| 101 | substrate |
| 102 | electronically conductive polymer layer |
| 103 | anode comprised of conductive multilayer of the invention |
| 104 | a conductive carbon nanotube layer |
| 105 | hole-injecting layer |
| 107 | hole-transporting layer |
| 109 | light-emitting layer |
| 111 | electron-transporting layer |
| 113 | cathode |
| 250 | voltage/current source |
| 260 | electrical conductors |
| 298 | conductive article |
| 299 | conductive article |
| 300 | substrate |
| 302 | conductive layer comprising electronically conductive polymer |
| 304 | conductive layer comprising carbon nanotube |
| 301 | microscope slide |
| 308 | bottom device side electrode |
| 303 | dielectric spacer dots |
| 312 | copper foil tape |
| 305 | double sided adhesive tape |
| 306 | top touch side electrode |

The invention claimed is:

1. An electronically conductive article comprising, in order, a substrate, a discrete continuous conductive layer comprising an electronically conductive polymer, and at least one conductive carbon nanotube layer in contact with and formed over the discrete continuous conductive layer, and wherein said electronically conductive polymer comprises a polythiophene and a polyanion, wherein said polythiophene has the following formula

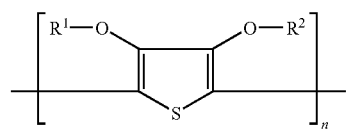

in a cationic form, wherein each of R$^1$ and R$^2$ independently represents hydrogen or a C1-4 alkyl group or together represent an optionally substituted C1-4 alkylene group or a cycloalkylene group, an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000; and wherein said carbon nanotube layer contains carbon nanotubes that are functionalized with covalently attached hydrophilic groups comprising carboxylic acid or carboxylic acid salt, or mixtures thereof, or a sulfur-containing group selected from: SOxZy, wherein x ranges from 1-3, Z is a hydrogen atom or a metal cation and y ranges from 0 or 1 or mixtures thereof.

2. The article of claim 1 wherein said conductive article is transparent.

3. The article of claim 1 wherein said carbon nanotubes are single wall carbon nanotubes.

4. The article of claim 1 wherein said carbon nanotubes in said at least one carbon nanotube layer are present in an amount of between 1 and 100 milligrams per square foot.

5. The article of claim 1 wherein said at least one carbon nanotube layer comprises between 40 and 100 weight percent of carbon nanotubes.

6. The article of claim 1 wherein said carbon nanotubes in said layer comprising carbon nanotubes are in a polymer matrix.

7. The article of claim 1 wherein said article further comprises a support of polyester, cellulose ester, polycarbonate or glass.

8. The article of claim 1 wherein said article has a visual light transmission of greater than 70 percent.

9. The article of claim 1 wherein said layer comprising carbon nanotubes or said layer comprising electronically conductive polymer further comprises a cross-linking agent.

10. The article of claim 1 wherein said layers are preformed and laminated together.

11. The article of claim 1 wherein said layers are sequentially cast.

12. The article of claim 1 wherein at least one of said layers is in a pattern.

13. The article of claim 1 further comprising a coating on said substrate on the side of the substrate opposite to the side with said conductive layers.

14. The article of claim 13 wherein said coating on said substrate opposite to said conductive layers comprises a hardcoat.

15. The article of claim 1 wherein the said article has a sheet resistance up to 10,000 ohms/sq.

16. The article of claim 1 wherein the said article has a sheet resistance of between 0.001 and 500 ohms/sq.

17. The article of claim 1 wherein the individual carbon nanotubes have a length of between 10 nanometers and 1 meter.

18. The article of claim 1 wherein the individual carbon nanotubes have a diameter of between 0.5 and 4 nanometers.

19. The article of claim 1 further comprising a conductivity enhancer formed in any one or more of the conductive layers.

20. The article of claim 1 wherein the conductive carbon nanotube layer or the conductive layer comprising electronically conductive polymer have a thickness of between 10 nanometers and 1 micrometer.

21. The article of claim 1 wherein the conductive carbon nanotube layer has a thickness of 1 nanometer to 1,000 nanometers.

22. The article of claim 1 wherein the at least one conductive layer comprising electronically conductive polymer has a figure of merit of less than or equal to 50.

23. A display device having an electronically conductive article according to the claim of claim 1.

24. A touchscreen comprising in order a touching electrode, spacer elements, a conductive carbon nanotube layer, a discrete continuous conductive layer comprising electronically conductive polymer, and a substrate, wherein the conductive carbon nanotube layer is formed over and is in contact with the discrete continuous conductive layer comprising an electronically conductive polymer, and wherein said electronically conductive polymer comprises a polythiophene and a polyanion, wherein said polythiophene has the following formula

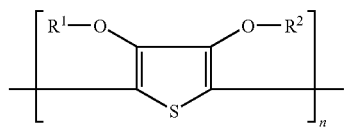

in a cationic form, wherein each of $R^1$ and $R^2$ independently represents hydrogen or a C1-4 alkyl group or together represent an optionally substituted C1-4 alkylene group or a cycloalkylene group, an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000; wherein said carbon nanotube layer contains carbon nanotubes that are functionalized with covalently attached hydrophilic groups comprising carboxylic acid or carboxylic acid salt, or mixtures thereof, or sulfur-containing group selected from: $SOxZy$, wherein x ranges from 1-3, Z is a hydrogen atom or a metal cation and y ranges from 0 or 1, or mixtures thereof.

25. The touchscreen of claim 24 further comprising a coating on said substrate opposite to said conductive layers.

26. The touchscreen of claim 25 wherein said coating on said substrate on the side opposite to the side with said conductive layers comprises a hardcoat.

27. The touchscreen of claim 25 wherein said coating is an anti-reflection coating.

28. The touchscreen of claim 25 wherein said coating is an anti-glare coating.

29. A method of forming an electronically conductive article comprising:
   A) applying a conductive layer composition to a substrate to form a continuous conductive layer, and
   B) after drying said continuous conductive layer, forming at least one conductive carbon nanotube layer over and in contact with said dried continuous conductive layer, during which the dried continuous conductive layer remains discrete, and said dried discrete continuous conductive layer comprises an electronically conductive polymer, wherein said electronically conductive polymer comprises a polythiophene and a polyanion, wherein said polythiophene has the following formula

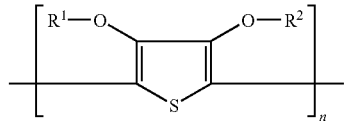

in a cationic form, wherein each of $R^1$ and $R^2$ independently represents hydrogen or a C1-4 alkyl group or together represent an optionally substituted C1-4 alkylene group or a cycloalkylene group, an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000; and wherein said carbon nanotube layer contains carbon nanotubes that are functionalized with covalently attached hydrophilic groups comprising carboxylic acid or carboxylic acid salt, or mixtures thereof or a sulfur-containing group selected from: $SOxZy$, wherein x ranges from 1-3, Z is a hydrogen atom or a metal cation and y ranges from 0 or 1, or mixtures thereof.

* * * * *